(12) United States Patent
Sugimoto et al.

(10) Patent No.: US 12,148,804 B2
(45) Date of Patent: Nov. 19, 2024

(54) SEMICONDUCTOR DEVICE INCLUDING ONE OR MORE P-TYPE SEMICONDUCTORS PROVIDED BETWEEN AN N-TYPE SEMICONDUCTOR LAYER AND AN ELECTRODE

(71) Applicant: FLOSFIA INC., Kyoto (JP)

(72) Inventors: Masahiro Sugimoto, Kyoto (JP); Isao Takahashi, Kyoto (JP); Takashi Shinohe, Kyoto (JP); Koji Amazutsumi, Kyoto (JP)

(73) Assignee: FLOSFIA INC., Kyoto (JP)

( * ) Notice: Subject to any disclaimer, the term of this patent is extended or adjusted under 35 U.S.C. 154(b) by 0 days.

(21) Appl. No.: 17/259,622

(22) PCT Filed: Jul. 10, 2019

(86) PCT No.: PCT/JP2019/027376
§ 371 (c)(1),
(2) Date: Jan. 12, 2021

(87) PCT Pub. No.: WO2020/013242
PCT Pub. Date: Jan. 16, 2020

(65) Prior Publication Data
US 2021/0320179 A1    Oct. 14, 2021

(30) Foreign Application Priority Data

Jul. 12, 2018 (JP) ................ 2018-132761

(51) Int. Cl.
*H01L 29/24* (2006.01)
*H01L 29/417* (2006.01)
*H01L 29/872* (2006.01)

(52) U.S. Cl.
CPC ............ *H01L 29/417* (2013.01); *H01L 29/24* (2013.01); *H01L 29/872* (2013.01)

(58) Field of Classification Search
CPC ......... H01L 21/02414; H01L 21/02483; H01L 21/02565; H01L 29/0696; H01L 29/1095; H01L 29/1608; H01L 29/861–885
See application file for complete search history.

(56) References Cited

U.S. PATENT DOCUMENTS 5,612,567 A * 3/1997 Baliga ................ H01L 29/8725
257/513
9,117,739 B2   8/2015 Zhang
(Continued)

FOREIGN PATENT DOCUMENTS

JP   52-101970    8/1977
JP   2009-224603  10/2009
(Continued)

OTHER PUBLICATIONS

Ying Zhang, Jinliang Yan, Yijun Zhang, Ting Li, Xingwei Ding, "A comparison of electronic structure and optical properties between N-doped β-Ga2O3 and N—Zn co-doped β-Ga2O3" in Physica B: Condensed Matter, vol. 407, Issue 8, 2012, pp. 1227-1231, (Year: 2012).*

(Continued)

*Primary Examiner* — Eric A. Ward
(74) *Attorney, Agent, or Firm* — Wenderoth, Lind & Ponack, L.L.P.

(57) ABSTRACT

A semiconductor device with enhanced semiconductor characteristics that is useful for power devices. A semiconductor device, including: an n-type semiconductor layer; one or more p-type semiconductors; an electrode, the one or more p-type semiconductors that are provided between the n-type semiconductor layer and the electrode, and at least a part of the one or more p-type semiconductors is protruded in the electrode.

16 Claims, 14 Drawing Sheets

(56) References Cited

U.S. PATENT DOCUMENTS

| | | | |
|---|---|---|---|
| 9,595,618 | B2 | 3/2017 | Zhang |
| 11,355,594 | B2* | 6/2022 | Sasaki .................... H01L 29/47 |
| 2009/0230405 | A1* | 9/2009 | Yamamoto .......... H01L 29/0619 |
| | | | 257/77 |
| 2011/0215338 | A1* | 9/2011 | Zhang .................. H01L 29/861 |
| | | | 257/77 |
| 2013/0032809 | A1* | 2/2013 | Allen .................... H01L 29/861 |
| | | | 257/E29.338 |
| 2014/0048902 | A1* | 2/2014 | Raj .................. H01L 29/66143 |
| | | | 257/E29.338 |
| 2015/0076522 | A1 | 3/2015 | Zhang |
| 2015/0279927 | A1* | 10/2015 | Hitora .................. H01L 21/477 |
| | | | 257/43 |
| 2015/0325660 | A1* | 11/2015 | Hitora .................... H01L 29/22 |
| | | | 257/43 |
| 2018/0315820 | A1* | 11/2018 | Kub .................. H01L 29/66916 |
| 2019/0267237 | A1* | 8/2019 | Yuda .................... H01L 29/872 |
| 2020/0235234 | A1* | 7/2020 | Sasaki .................. H01L 29/802 |
| 2021/0020789 | A1* | 1/2021 | Sasaki ............... H01L 29/66143 |
| 2021/0074826 | A1* | 3/2021 | Watahiki ........... H01L 29/66212 |

FOREIGN PATENT DOCUMENTS

| | | |
|---|---|---|
| JP | 2013-522876 | 6/2013 |
| JP | 2014-78660 | 5/2014 |
| JP | 2014-107408 | 6/2014 |
| WO | 2016/013554 | 1/2016 |
| WO | 2018/037705 | 3/2018 |
| WO | 2018/043503 | 3/2018 |
| WO | 2019/013136 | 1/2019 |

OTHER PUBLICATIONS

"Effect of annealing on the properties of Ga2O3:Mg films prepared on α-Al2O3 (0001) by MOCVD" by Xianjin Feng et al. in Vacuum, vol. 124, p. 101-107 (Year: 2016).*

"Electronic structure and optical property of metal-doped Ga2O3: a first principles study" by Cheng Tang et al. in RSC Adv., 2016, 6, 78322 (Year: 2016).*

Masaya Oda et al., "Vertical Schottky Barrier Diodes of α-Ga$_2$O$_3$ Fabricated by Mist Epitaxy", 2015 73rd Annual Device Research Conference (DRC), IEEE, Jun. 21, 2015, pp. 137-138, XP033188802.

Shizou Fujita, "Corundum-structured n-type and p-type wide band gap oxide semiconductors", Workshop on Frontier Photonic and Electronic Materials and Devices: 2017 German-Japanese-Spanish Joint Workshop, Mallorca, Spain, Mar. 5, 2017, p. 27, XP009521228.

Kentaro Kaneko et al., "A power device material of corundum-structured α-Ga$_2$O$_3$ fabricated by Mist Epitaxy® technique", Japanese Journal of Applied Physics, vol. 57, No. 2S2, Jan. 22, 2018, p. 02CB18, XPO55899381.

International Search Report issued Oct. 8, 2019 in International (PCT) Patent Application No. PCT/JP2019/027376.

Extended European Search Report issued in Mar. 23, 2022 in European Patent Application No. 19835132.2.

* cited by examiner (a)

(b)

(c)

(d)

(e)

(f)

(g)

SEMICONDUCTOR DEVICE INCLUDING ONE OR MORE P-TYPE SEMICONDUCTORS PROVIDED BETWEEN AN N-TYPE SEMICONDUCTOR LAYER AND AN ELECTRODE

TECHNICAL FIELD

The disclosure relates to a semiconductor device that is useful for a power device and a semiconductor system that including the semiconductor device.

BACKGROUND ART

A semiconductor device including a Schottky barrier electrode that is arranged on a semiconductor substrate is known, and various Schottky barrier electrodes have been studied for the purposes of, for example, increasing a reverse direction withstand voltage or decreasing a forward direction turn-on voltage.

Patent Literature 1 describes to provide a first metal on a central portion of a semiconductor and forming a Schottky contact of a second metal and the semiconductor at a peripheral portion of the semiconductor. Here, barrier height between the first metal and the semiconductor is lower and barrier height between the second metal and the semiconductor is higher, in order to increase a reverse direction withstand voltage and to decrease a forward direction turn-on voltage.

Further, it has been also studied on a combination of a Schottky electrode and an Ohmic electrode. For example, Patent Literature 2 describes a wide band gap semiconductor device including a Schottky electrode made of a metal and an Ohmic electrode made of the same type of metal with the Schottky electrode that are arranged on a substrate, and describes that such a configuration enables to improve a thermal breakdown resistance in case that a high current such as a surge current flows in a forward direction. However, there is a problem in an adhesion at an interface of a Schottky junction and an Ohmic junction, an electrode material has to be limited, or there is a problem that barrier height changes depending on a temperature, and it is not necessarily satisfactory. Therefore, a semiconductor device with a low turn-on voltage and an enhanced thermal stability has been expected.

Patent Literature 3 describes a semiconductor device including electrically conductive guard ring that is connected to a main junction bonded on a Schottky electrode, via a short circuit portion, and describes that such a semiconductor device alleviates an electric field concentration and contributes to improving a withstand voltage. However, even when arranging a large number of guard rings, there is a problem of deteriorating a withstand voltage on the contrary because the guard rings are shorted to the main junction.

RELATED ART

Patent Literature

Patent Literature 1 JP-52-101970 discloses
Patent Literature 2 JP-A-2014-78660
Patent Literature 3 JP-A-2014-107408

SUMMARY OF INVENTION

Technical Problem

An object of the disclosure is to provide a semiconductor device with enhanced semiconductor properties.

Solution to Problem

As a result of earnest examination to achieve the above object, the inventors found that, a semiconductor device, including: an n-type semiconductor layer; one or more p-type semiconductors; an electrode, the one or more p-type semiconductors that are provided between the n-type semiconductor layer and the electrode, and at least a part of the one or more p-type semiconductors is protruded in the electrode enables to reduce a contact resistance, suppressing electric field concentration, and also to enhance withstand voltage of the semiconductor device. The inventors also found that the semiconductor device can solve the above-mentioned problem.

In addition, after learning the above findings, the inventors have made further research to complete the disclosure. That is, the disclosure relates to the followings.

[1] A semiconductor device, including: an n-type semiconductor layer; one or more p-type semiconductors; an electrode, the one or more p-type semiconductors that are provided between the n-type semiconductor layer and the electrode, and at least a part of the one or more p-type semiconductors is protruded in the electrode.

[2] The semiconductor device according to [1] above, wherein the one or more p-type semiconductors are embedded in the electrode.

[3] The semiconductor device according to [1] or [2] above, wherein three p-type semiconductors are provided between the n-type semiconductor layer and the electrode.

[4] The semiconductor device according to any one of [1] to [3] above, wherein the n-type semiconductor layer contains an oxide semiconductor as a major component.

[5] The semiconductor device according to any one of [1] to [4] above, wherein the n-type semiconductor layer contains gallium compound as a major component.

[6] The semiconductor device according to any one of [1] to [5] above, wherein the n-type semiconductor layer contains a crystalline oxide semiconductor having a corundum structure or a hexagonal structure as a major component.

[7] The semiconductor device according to [1] to [6] above, wherein the one or more p-type semiconductors is an oxide semiconductor, and wherein the oxide semiconductor contains one or more metals selected from Group 13 and Group 9 of the periodic table.

[8] The semiconductor device according to any one of [1] to [7] above, wherein the one or more p-type semiconductors contains an oxide semiconductor containing gallium.

[9] The semiconductor device according to any one of [1] to [8] above, wherein the one or more p-type semiconductors are crystalline oxide semiconductors having a corundum structure or a hexagonal structure.

[10] The semiconductor device according to any one of [1] to [9] above, wherein ten or more p-type semiconductors are provided between the n-type semiconductor layer and the electrode.

[11] The semiconductor device according to any one of [1] to [10] above, wherein the one or more p-type semiconductors are epitaxially grown on the n-type semiconductor layer.

[12] The semiconductor device according to any one of [1] to [11] above, wherein the one or more p-type semiconductors include a lateral-growth area.
[13] The semiconductor device according to any one of [1] to [12] above, wherein the semiconductor device is a diode.
[14] The semiconductor device according to any one of [1] to [13] above, wherein the semiconductor device is a Junction barrier Schottky diode.
[15] The semiconductor device according to any one of [1] to [14] above, wherein the semiconductor device is a power device.
[16] A semiconductor system, including: a semiconductor device according to any one of claims 1 to 15.

Advantageous Effect of the Disclosure

The semiconductor device according to the disclosure has enhanced semiconductor properties.

DESCRIPTION OF EMBODIMENT

Figure 1:
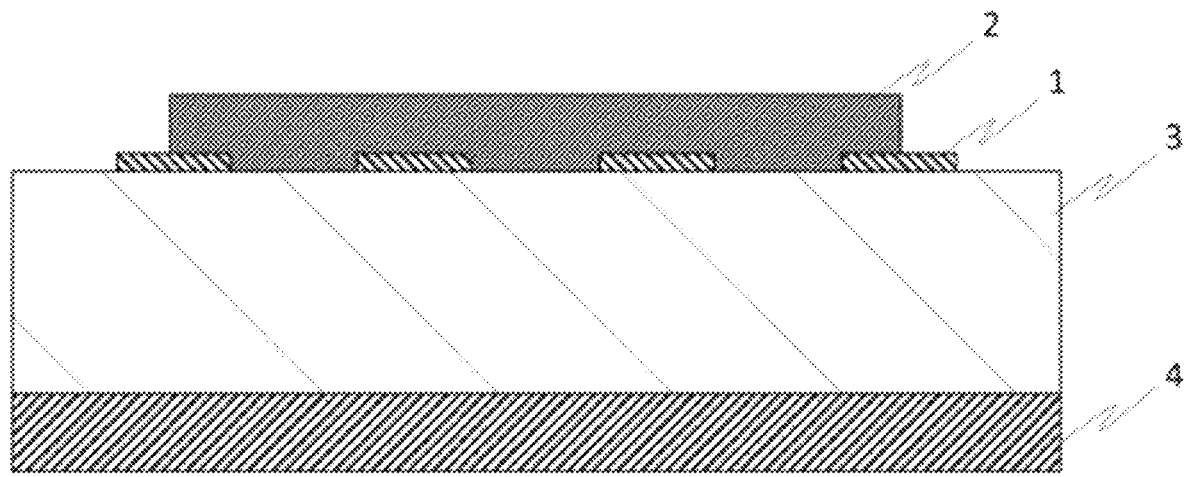
FIG. 1 is a schematic diagram illustrating a preferred embodiment of a junction barrier Schottky diode (JBS) according to the disclosure.

The semiconductor device according to an embodiment of the disclosure is a semiconductor device, including: an n-type semiconductor layer; one or more p-type semiconductors; an electrode, the one or more p-type semiconductors that are provided between the n-type semiconductor layer and the electrode, and at least a part of the one or more p-type semiconductors is protruded in the electrode. According to an embodiment of the disclosure, it is preferable that the part of one or more p-type semiconductors is embedded in the electrode. The one or more p-type semiconductors may be embedded in the n-type semiconductor layer, by embedding the part of the one or more p-type semiconductors in the n-type semiconductor layer by using a known method. According to such a preferred embodiment, electric field concentration would be more suppressed and a contact resistance would be reduced more.

The electrode is not particularly limited and may be a known electrode. A material of the electrode is not particularly limited as long as the material can be used as an electrode. The material of the electrode may be an electrically conductive inorganic material or may be an electrically conductive organic material. According to an embodiment of the disclosure, the material of the electrode layer is preferably a metal. The metal is not particularly limited. Examples of the metal include at least one metal selected from groups 4 to 11 of the Periodic Table. Examples of a metal of group 4 of the Periodic Table include titanium (Ti), zirconium (Zr), and hafnium (Hf). Among them, Ti is preferred. Examples of a metal of group 5 of the Periodic Table include vanadium (V), niobium (Nb) and tantalum (Ta). Examples of a metal of group 6 of the Periodic Table include one or more metals selected from chromium (Cr), molybdenum (Mo) and tungsten (W) According to an embodiment of the disclosure, the metal of group 6 of the periodic table is preferably Cr. By using such a preferred metal, more enhanced semiconductor properties such as switching characteristics may be realized. Examples of a metal of group 7 of the Periodic Table include manganese (Mn), technetium (Tc), and rhenium (Re) Examples of a metal of group 8 of the Periodic Table include iron (Fe), ruthenium (Ru), and osmium (Os). Examples of a metal of group 9 of the Periodic Table include cobalt (Co), rhodium (Rh), and iridium (Ir). Examples of a metal of group 10 of the Periodic Table include nickel (Ni), palladium (Pd), and platinum (Pt). Among them, Pt is preferred. Examples of a metal of group 11 of the periodic table include copper (Cu), silver (Ag), and gold (Au). Examples of the method of forming the electrode include a known method. The method of forming the electrode, more specifically, for example, is a dry method or a wet method. The dry method may be, for example, a known method such as sputtering, vacuum deposition, and CVD. The wet method may be, for example, screen printing, and die coating. According to an embodiment of the disclosure, the electrode is preferably a barrier electrode (Schottky electrode) that forms a Schottky barrier having a certain barrier height at an interface between the n-type semiconductor layer and the electrode.

The n-type semiconductor layer is not particularly limited as long as the n-type semiconductor includes a semiconductor as a major component. According to an embodiment of the disclosure, the n-type semiconductor layer preferably includes an oxide semiconductor as a major component. According to an embodiment of the disclosure, the n-type semiconductor layer more preferably includes a crystalline oxide semiconductor as a major component. The crystalline oxide semiconductor preferably has a β-gallia structure, a corundum structure, or a hexagonal structure. The crystalline oxide semiconductor more preferably has a corundum structure, a hexagonal structure. The crystalline oxide semiconductor most preferably has a corundum structure. Also, the n-type semiconductor layer preferably contains a gallium-compound as a major component, more preferably contains an InAlGaO-based semiconductor as a major component. The n-type semiconductor layer most preferably contains $\alpha$-$Ga_2O_3$ or a mixed crystal of $\alpha$-$Ga_2O_3$ as a major component. "major component" herein means, for example, when the crystalline oxide semiconductor is $\alpha$-$Ga_2O_3$, $\alpha$-$Ga_2O_3$ is contained in the n-type semiconductor layer at an atomic ratio of gallium in all the metal element contained in the n-type semiconductor layer that is equal to or more than 0.5. According to an embodiment of the disclosure, it is preferable that the atomic ratio of gallium in all the metal element contained in the n-type semiconductor layer is equal to or more than 0.7, and more preferably equal to or more than 0.8. A thickness of the semiconductor layer is not particularly limited. The thickness of the semiconductor layer may be equal to or less than 1 μm and may be equal to or more than 1 μm. According to an embodiment of the disclosure, the thickness of the semiconductor layer may be preferably in a range of from 1 μm to 40 μm. According to an embodiment of the disclosure, the thickness of the semiconductor layer may be more preferably in a range of from 1 μm to 25 μm. A surface area of the n-type semiconductor layer is not particularly limited. The surface area of the n-type semiconductor layer may be equal to or more than 1 $mm^2$, and may be equal to or less than 1 $mm^2$. The crystalline oxide semiconductor is usually a single crystal, but may be polycrystalline. Also, the n-type semiconductor layer may be a single layer film, or may be a multilayer film. When the n-type semiconductor layer is a multilayer film, the multilayer film preferably has a film thickness that is equal to or less than 40 μm. In case that the n-type semiconductor layer is a multilayer film including at least a first semiconductor layer and a second semiconductor layer and the Schottky electrode is provided on the first semiconductor layer, a carrier concentration of the first semiconductor layer is preferably smaller than a carrier concentration of the second semiconductor layer. In this case, the second semiconductor layer usually contains a dopant. The carrier concentration of the semiconductor layer may be appropriately set by adjusting an amount of the dopant. Also, an orientation of a main surface of the n-type semiconductor layer is not particularly limited. Examples of the orientation of the main surface of the n-type semiconductor layer include a c-plane, m-plane, $\alpha$-plane, and r-plane. According to an embodiment of the disclosure, it is preferable that the plane orientation of the main surface of the n-type semiconductor layer is m-plane.

The n-type semiconductor layer preferably contains a dopant. The dopant is not particularly limited and may be a known dopant. Examples of the dopant include n-type dopants such as tin, germanium, silicon, titanium, zirconium, vanadium and niobium. According to an embodiment of the disclosure, the dopant is preferably Sn, Ge or Si. The content of the dopant in a composition of the semiconductor layer is preferably equal to or more than 0.00001 atomic %, more preferably in a range of from 0.00001 atomic % to 20 atomic %, and most preferably in a range of 0.00001 atomic % to 10 atomic %. According to an embodiment of the disclosure, when the n-type semiconductor layer is a multilayer film including a first semiconductor layer and a second semiconductor layer, it is preferable that the dopant used for the first semiconductor layer is germanium, silicon, titanium, zirconium, vanadium or niobium, and the dopant used for the second semiconductor layer is tin. Such a preferred configuration enables to further enhance semiconductor properties without impairing the adhesion.

The n-type semiconductor layer is formed, for example, by using a method such as mist CVD method, and more specifically, the n-type semiconductor layer may be preferably obtained by a method including, turning a raw material solution into atomized droplets (atomization step), carrying the obtained atomized droplets to a base with a carrier gas (carrying step), then, depositing a semiconductor film containing a crystalline oxide semiconductor as a major component on the base by thermally reacting the atomized droplets in the deposition chamber (deposition step).

(Atomization Step)

At an atomization step, the raw material solution is turned into atomized droplets. A method of forming atomized droplets from the raw material solution is not particularly limited, as long as the raw material solution is able to be turned into atomized droplets, and may be a known method. According to one or more embodiments of the disclosure, a method of forming atomized droplets using ultrasonic vibration is preferable. Atomized droplets including mist particles and obtained by using ultrasonic vibration and floating in the space have the initial velocity that is zero. Since atomized droplets floating in the space is carriable as a gas, the atomized droplets floating in the space are preferable to avoid damage caused by the collision energy without being blown like a spray. The droplet size is not particularly limited and may be a droplet of about several millimeters, but is preferably 50 μm or less, and more preferably 100 nm to 10 μm.

(Raw Material Solution)

The raw material solution is not particularly limited as long as the atomized droplets can be formed from the raw material solution and as long as the raw material solution includes a raw material capable of forming the n-type semiconductor layer. The raw material may be an inorganic material or an organic material. According to one or more embodiments of the disclosure, the raw material is preferably a metal or a metal compound, and more preferably contains one or more metals selected from among gallium, iron, indium, aluminum, vanadium, titanium, chromium, rhodium, nickel, cobalt, zinc, magnesium, calcium, silicon, yttrium, strontium and barium.

According to one or more embodiments of the disclosure, a raw material solution containing at least one metal, in a form of complex or salt, dissolved or dispersed in an organic solvent or water may be used. Examples of the form of the complex include an acetylacetonate complex, a carbonyl complex, an ammine complex and a hydride complex. Examples of the form of the salt includes an organic metal salt (e.g., metal acetate, metal oxalate, metal citrate, etc.), metal sulfide, metal nitrate, phosphorylated metal and metal halide (e.g., metal chloride, metal bromide, metal iodide, etc.).

Further, raw material solution may contain a hydrohalic acid and/or an oxidant as an additive. Examples of the hydrohalic acid include hydrobromic acid, hydrochloric acid and hydroiodic acid. Among all, hydrobromic acid or hydroiodic acid may be preferable for a reason to obtain a film of better quality. Examples of the oxidant include hydrogen peroxide ($H_2O_2$), sodium peroxide ($Na_2O_2$), barium peroxide ($BaO_2$), a peroxide including benzoyl peroxide ($C_6H_5CO)_2O_2$, hypochlorous acid (HClO), perchloric acid, nitric acid, ozone water, and an organic peroxide such as peracetic acid and nitrobenzene.

The raw material solution may contain a dopant. By adding a dopant into the raw material solution, it is possible to preferably perform doping. The dopant is not particularly limited unless it deviates from an object of the disclosure. Examples of the dopant include n-type dopants. The n-type dopants may include tin, germanium, silicon, titanium, zirconium, vanadium or niobium. Also, examples of the dopant include p-type dopants. The dopant concentration in general may be approximately in a range of from $1 \times 10^{16}/cm^3$ to $1 \times 10^{22}/cm^3$. The dopant concentration may be at a lower concentration of, for example, approximately equal to or less than $1 \times 10^{17}/cm^3$. According to one or more embodiments of the disclosure, the dopant may be contained at a high concentration of, for example, approximately equal to or more than $1 \times 10^{20}/cm^3$. According to one or more embodiments of the disclosure, it is preferable that the dopant is contained in a carrier concentration of equal to or more than $1 \times 10^{17}/cm^3$.

A solvent of the raw material solution is not particularly limited unless it deviates from an object of the disclosure. The solvent may be an inorganic solvent such as water. The solvent may be an organic solvent such as alcohol. Also, the solvent may be a mixed solvent of the inorganic solvent and the organic solvent. According to one or more embodiments of the disclosure, the solvent preferably includes water. According to one or more embodiments of the disclosure, the solvent is more preferably water or a mixed solvent of water and alcohol.

(Carrying Step)

At a carrying step, the atomized droplets are delivered to a deposition chamber by using a carrier gas. The carrier gas is not particularly limited unless it deviates from an object of the disclosure. Examples of the carrier gas includes oxygen, ozone, an inert gas such as nitrogen or argon and a reduction gas such as hydrogen gas or a forming gas. Further, the carrier gas may contain one or two or more gasses. Also, a diluted gas (e.g., 10-fold diluted carrier gas) and the like may be further used as a second carrier gas. The carrier gas may be supplied from one or more locations. A flow rate of the carrier gas is not particularly limited. The flow rate of the carrier gas is preferably in a range of from 0.01 L/min to 20 L/min and more preferably in a range of from 1 L/min to 10 L/min. For the diluted carrier gas, a flow rate of the dilute carrier gas may be preferably in a range of from 0.001 L/min to 2 L/min, and more preferably in a range of from 0.1 L/min to 1 L/min.

(Deposition Step)

At a deposition step, the semiconductor film is deposited on the base by a thermal reaction of the atomized droplets in a deposition chamber. The thermal reaction is not particularly limited as long as the atomized droplets react with heat. Reaction conditions and the like are not particularly limited unless it deviates from an object of the disclosure. In the deposition step, the thermal reaction is in general carried out at an evaporation temperature of the solvent of the raw material solution or at a higher temperature than the evaporation temperature. The temperature during the thermal reaction is equal to or less than a too high temperature (for example, 1000° C.), and preferably equal to or less than 650° C., and more preferably in a range of from 300° C. to 650° C. Further, the thermal reaction may be conducted, unless it deviates from an object of the disclosure, in any atmosphere of a vacuum, a non-oxygen atmosphere, a reducing gas atmosphere and an oxygen atmosphere. According to an embodiment of the disclosure, the thermal reaction may be preferably conducted in a non-oxygen atmosphere or an oxygen atmosphere. Further, the thermal reaction may be conducted in any conditions of under atmospheric pressure, under increased pressure, and under a reduced pressure. According to one or more embodiments of the disclosure, the thermal reaction may be preferably conducted under an atmospheric pressure. Further, a film thickness can be set by adjusting a deposition time.

(Base)

A base is not particularly limited as long as the base can support the semiconductor film. A material of the base is not particularly limited unless it deviates from an object of the disclosure, and may be a known base. The base may be an organic compound, or may be an inorganic compound. The base may be in any shape, and can perform for any shape. Examples of the shape of the base includes plate such as flat plate or a disc, fibrous, bar, columnar, prismatic, cylindrical, spiral, spherical and annular. According to one or more embodiments of the disclosure, the base is preferably a substrate. A thickness of the substrate is not particularly limited according to one or more embodiments of the disclosure.

The substrate is not particularly limited as long as the substrate is in the shape of plate and can support the semiconductor film. The substrate may be an insulator substrate or a semiconductor substrate. The substrate may be an insulator substrate, a semiconductor substrate, a metal substrate or a conductive substrate. According to an embodiment of the disclosure, the substrate is preferably an insulator substrate. It is also preferable that the substrate may have a metal film on a surface thereof. Examples of the substrate include a substrate including a substrate material with a corundum structure as a major component, a substrate including a substrate material with a β-Gallia structure as a major component or a substrate including a substrate material with a hexagonal structure as a major component. The term "major component" herein means that the substrate preferably contains a substrate material with a particular crystalline structure at an atomic ratio of 50% or more to all components of a substrate material contained in the substrate. The substrate preferably contains the substrate material with the particular crystalline structure at an atomic ratio of 70% or more to all components of the substrate material contained in the substrate and more preferably contains at an atomic ratio of 90% or more. The substrate may contain the substrate material with the particular crystalline structure at an atomic ratio of 100% to all components of the substrate material contained in the substrate.

The substrate material is not particularly limited as long as it deviates from an object of the disclosure, and may be a known substrate material. Examples of the substrate material with the corundum structure include α-$Al_2O_3$ (sapphire substrate) or α-$Ga_2O_3$. Also, preferable examples of the substrate material with the corundum structure include an α-plane sapphire substrate, an m-plane sapphire substrate, an r-plane sapphire substrate, a c-plane sapphire substrate and an α-type gallium oxide substrate (α-plane, m-plane or r-plane). Examples of the substrate including the substrate material with the β-Gallia structure as a major component include a β-Ga$_2$O$_3$ substrate or a mixed crystal substrate containing Al$_2$O$_3$ and Ga$_2$O$_3$ where Al$_2$O$_3$ is more than 0 wt % and equal to or less than 60 wt %. Examples of the substrate including the substrate material with a hexagonal structure include a SiC substrate, a ZnO substrate and a GaN substrate. According to an embodiment of the disclosure, the sapphire substrate is preferably an m-plane sapphire substrate.

According to one or more embodiments of the disclosure, annealing may be performed after the deposition step. An annealing temperature is not particularly limited unless it deviates from an object of the disclosure. The annealing temperature may be generally in a range of from 300° C. to 650° C., and may be preferably in a range of from 350° C. to 550° C. An annealing time is generally in a range of from 1 minute to 48 hours, preferably in a range of from 10 minutes to 24 hours, and more preferably in a range of from 30 minutes to 12 hours. The annealing may be performed in any atmosphere unless it deviates from an object of the disclosure. According to an embodiment of the disclosure, the thermal reaction is preferably performed in a non-oxygen atmosphere, more preferably performed in a nitrogen atmosphere According to one or more embodiments of the disclosure, the semiconductor film may be provided directly on the base, or may be provided via another layer such as a buffer layer or a stress relief layer. A forming method of each layer is not particularly limited and may be a known method, however, a mist CVD method is preferred according to one or more embodiments of the disclosure.

Also, according to one or more embodiments of the disclosure, the semiconductor film that is separated from the base and the like by use of a known method may be used as the semiconductor region. The semiconductor film may be used as the semiconductor region, as it is.

The p-type semiconductor (the one or more p-type semiconductors) is not particularly limited unless it deviates from an object of the disclosure. Examples of the p-type semiconductor include a crystalline oxide semiconductor that is p-type doped by use of a p-type dopant (preferably Mg, Zn or Ca). In addition to Mg, Zn and Ca, examples of the p-type dopant include, one or more elements selected from H, Li, Na, K, Rb, Cs, Fr, Be, Sr, Ba, Ra, Mn, Fe, Co, Ni, Pd, Cu, Ag, Au, Cd, Hg, Tl, Pb, N, and P. The p-type semiconductor preferably has a corundum structure or a hexagonal structure, and more preferably has a corundum structure. According to an embodiment of the disclosure, the p-type semiconductor is preferably an oxide semiconductor containing one or more metals selected from Group 9 and Group 13 of the periodic table. Examples of a metal of group 9 of the Periodic Table include cobalt, rhodium and iridium. According to embodiment of the disclosure, the iridium is preferred. Examples of a metal of group 13 of the Periodic Table include aluminum, gallium and indium. According to one or more embodiments of the disclosure, the p-type semiconductor more preferably contains an InAlGaO-based semiconductor as a major component, and the most preferably contains α-Ga$_2$O$_3$ or a mixed crystal of α-Ga$_2$O$_3$ as a major component. Examples of the mixed crystals of the alpha-Ga$_2$O$_3$ include a mixed crystal of α-Ga$_2$O$_3$ and one or more of metal oxides. Preferable examples of the metal oxide include aluminum oxide, indium oxide, iridium oxide, rhodium oxide and iron oxide. According to an embodiment of the disclosure, the mixed crystal of α-Ga$_2$O$_3$ is preferably a mixed crystal of the α-Ga$_2$O$_3$ and α-Ir$_2$O$_3$. The p-type semiconductor may be obtained by, for example, mist-CVD method using a raw material solution including a metal and additionally including the p-type dopant and hydrobromic acid. Each step and each condition of the mist CVD method may be the same as each step and each condition of the atomization step, the carrying step and the deposition step. A number of the one or more p-type semiconductors is not particularly limited unless it deviates from an object of the disclosure. According to an embodiment of the disclosure, the number of the one or more p-type semiconductors is preferably equal to or more than three. Such a preferred configuration enables to suppress the electric field concentration more effectively. Also, such a preferred configuration enables to further enhance the electrical properties of the semiconductor device. According to an embodiment of the disclosure, the number of the one or more p-type semiconductors is more preferably equal to or more than four, more preferably equal to or more than ten, and most preferably equal to or more than forty. According to such a preferred embodiment, a threshold voltage of the semiconductor device may be further lowered and temperature stability of the semiconductor device may be more enhanced. Also, such a preferred embodiment enables to further enhance withstand voltage of the semiconductor device. According to an embodiment of the disclosure, it is preferable that two or more p-type semiconductors are protruded into the electrode, and it is more preferable that three or more p-type semiconductors are protruded into the electrode. In this a case, a distance from a first p-type semiconductor to a second p-type semiconductor that is adjacent to the first p-type semiconductor is not particularly limited unless it deviates from an object of the disclosure. According to an embodiment of the disclosure, the distance between the first p-type semiconductor and the second p-type semiconductor may be preferably in a range of from 0.125 μm to 4 μm. Further, the p-type semiconductor is preferably embedded in the n-type semiconductor layer. A depth of the p-type semiconductor embedded in the n-type semiconductor layer is not particularly limited unless it deviates from an object of the disclosure. According to an embodiment of the disclosure the depth of the p-type semiconductor embedded in the n-type semiconductor layer is preferably in a range of from 0.125 μm to 4 μm. Also, according to an embodiment of the disclosure, the p-type semiconductor is preferably epitaxially-grown on the n-type semiconductor layer. According to an embodiment of the disclosure, it is also preferable that the p-type semiconductor includes a lateral-growth region. By using such a preferred p-type semiconductor, even when the crystalline oxide semiconductor has a corundum structure, it is possible to achieve a better performance as a junction barrier Schottky diode (JBS).

When the p-type semiconductor is an oxide semiconductor containing iridium, the p-type semiconductor may be formed, for example, by using a metal oxide gas as a raw material, and conducting a crystal growth on a base having a corundum structure. In more detail, for example, a solid substance (e.g., powder) of the metal oxide gas is sublimed (sublimation step), and then crystal growth is conducted on the base having the corundum structure, using the obtained metal oxide gas (crystal growth step).

(Sublimation Step)

At the sublimation step, a solid substance of the metal oxide gas (e.g., powder) is sublimed to form a gaseous state and to, thereby obtaining a metal oxide gas. Examples of the metal oxide gas include a gaseous oxide of a metal that is contained in the p-type oxide semiconductor film. A valence and the like of the metal oxide is not particularly limited unless it deviates from an object of the disclosure. The valence of the metal oxide may be monovalent and may be divalent. The valence of the metal oxide may be trivalent or tetravalent. According to an embodiment of the disclosure, the metal oxide preferably contains a metal of group 9 of the periodic table, and more preferably contains iridium. When the p-type oxide semiconductor contains a mixed crystal, it is also preferable that the metal oxide contains iridium and a metal of group 9 of the periodic table other than iridium, or a metal of group 13 of the periodic table. By using a preferred metal oxide as described above, a p-type semiconductor that has a band gap of equal to or more than 2.4 eV. Therefore, it is possible to exhibit a wider band gap and enhanced electrical properties in the p-type semiconductor.

According to one or more embodiments of the disclosure, when the p-type oxide semiconductor is an oxide semiconductor containing iridium, $IrO_2$ gas is preferably used as the metal oxide gas. Examples of the sublimation method include heating method. A heating temperature is not particularly limited, but is preferably in a range of from 600° C. to 1200° C., more preferably in a range of from 800° C. to 1000° C. According to one or more embodiments of the disclosure, it is preferable that the metal oxide gas obtained by sublimation is transported to a base by a carrier gas. A type of the carrier gas is not particularly limited unless it deviates from an object of the disclosure. Examples of the carrier gas include oxygen, ozone, an inert gas such as nitrogen, or argon, or a reducing gas such as a hydrogen gas or a forming gas. In an embodiment of the present invention, oxygen is preferably used as the carrier gas. According to one or more embodiments of the disclosure, it is preferable to use oxygen as the carrier gas. Examples of the carrier gas that uses oxygen include air, oxygen gas, ozone gas, and in particular, oxygen gas and/or ozone gas are preferable. Further, the carrier gas may contain one or two or more gasses. Also, a diluted gas (e.g., 10-fold diluted carrier gas) and the like may be further used as a second carrier gas. The carrier gas may be supplied from one or more locations. While a flow rate of the carrier gas is not particularly limited, but may be preferably in a range of from 0.01 L/min to 20 L/min and more preferably in a range of from 1 L/min to 10 L/min.

(Crystal Growth Step)

At the crystal growth step, a crystal growth is conducted in a vicinity of a surface of the base to form a film on a part or all of the surface of the base. A temperature of the crystal growth is preferably lower than the heating temperature in the sublimation step, more preferably equal to or less than 900° C. or less, and most preferably in a range of from 500° C. to 900° C. The crystal growth may be conducted in any atmosphere of a vacuum, a non-oxygen, atmosphere, a reducing gas atmosphere and an oxygen atmosphere, unless it deviates from an object of the disclosure. The crystal growth may be conducted in any conditions of under an atmospheric pressure, under an increased pressure, and under a reduced pressure, unless it deviates from an object of the disclosure According to one or more embodiments of the disclosure, it is preferable that the crystal growth is conducted under an oxygen atmosphere, preferably under an atmospheric pressure, and more preferably under an oxygen atmosphere and at atmospheric pressure. "Oxygen atmosphere" is not particularly limited as long as the oxygen atmosphere is an atmosphere in which a crystal of the metal oxide or a mixed crystal of the metal oxide can be formed and is an atmosphere in which oxygen or a compound including oxygen are present. The oxygen atmosphere may be formed, for example, by using a carrier gas including oxygen or by using an oxidant. Further, a film thickness can be set by adjusting a deposition time. According to one or more embodiments of the disclosure, the metal oxide gas may contain a p-type dopant to make the p-type semiconductor to be doped by the p-type dopant. Examples of the p-type dopant include Mg, H, Li, Na, K, Rb, Cs, Fr, Be, Ca, Sr, Ba, Ra, Mn, Fe, Co, Ni, Pd, Cu, Ag, Au, Zn, Cd, Hg, Tl, Pb, N, P, and two or more elements thereof. According to one or more embodiments of the disclosure, the p-type dopant is preferably a metal of Group 1 in the periodic table or a metal of Group 2 in the periodic table, more preferably a metal of Group 2 in the periodic table, and most preferably magnesium. Further, according to one or more embodiments of the disclosure, the p-type oxide semiconductor film obtained by the crystal growth process may be annealed.

The semiconductor device according to an embodiment of the disclosure generally includes an Ohmic electrode. The Ohmic electrode is not particularly limited unless it deviates from an object of the disclosure and may be a known electrode material. According to an embodiment of the disclosure, the Ohmic electrode may contain a metal of the Group 4 and/or Group 11 of the periodic table. Preferred metal of the Group 4 and/or Group 11 of the periodic table used for the Ohmic electrode may be same as the metal contained in the Schottky electrode. Also, the Ohmic electrode may be a single metal layer or may include two or more metal layers. A method of forming the Ohmic electrode is not particularly limited. Examples of the method of forming the Ohmic electrode include a known method such as a vacuum evaporation method or a sputtering method. The metal contained in the Ohmic electrode may be an alloy. According to one or more embodiments of the disclosure, the Ohmic electrode preferably contains Ti and/or Au.

Hereinafter, although preferable embodiments of the disclosure are described, the disclosure is not limited to these embodiments.

FIG. 1 illustrates a junction barrier Schottky diode (JBS) according to a preferred embodiment of the disclosure. The semiconductor device of FIG. 1 includes an n-type semiconductor layer 3, an electrode (barrier electrode) 2 that is provided on the n-type semiconductor layer 2 and capable of forming a Schottky barrier with the n-type semiconductor layer 3, and a p-type semiconductor (one or more p-type semiconductors) 1 that is provided between the barrier electrode 2 and the n-type semiconductor layer 3 and capable of forming a Schottky barrier with the n-type semiconductor layer. Here, barrier height at an interface between the p-type semiconductor 1 and the n-type semiconductor layer 3 is higher than barrier height at an interface between the barrier electrode 2 and the n-type semiconductor layer 3. The p-type semiconductor layer 1 is arranged on the n-type semiconductor layer 3, and protrude into the barrier electrode 2. According to one or more embodiments of the disclosure, the p-type semiconductor is preferably provided at regular intervals, and is more preferably provided respectively between the n-type semiconductor layer and both ends of the barrier electrode. Such a preferable embodiment enables the JBS with excellent semiconductor properties such as enhanced thermal stability and adhesion, further reduced current leakage, further suppressed electric field concentration, and further reduced contact resistance. The semiconductor device of FIG. 1 further includes an Ohmic electrode 4 that is provided on an opposite side of the n-type semiconductor layer 3 to the barrier electrode 2.

A method of forming each layer included in the semiconductor device of FIG. 1 is not particularly limited unless it deviates from an object of the disclosure, and may be a known method. Examples of the method of forming each layer include a method in which, after a film is formed using a vacuum evaporation method, a CVD method, a sputtering method or other various coating techniques, patterning is conducted by photolithography. Also, examples of the method of forming each layer include a method in which patterning is conducted directly by using a printing technique and the like.

Figure 2:
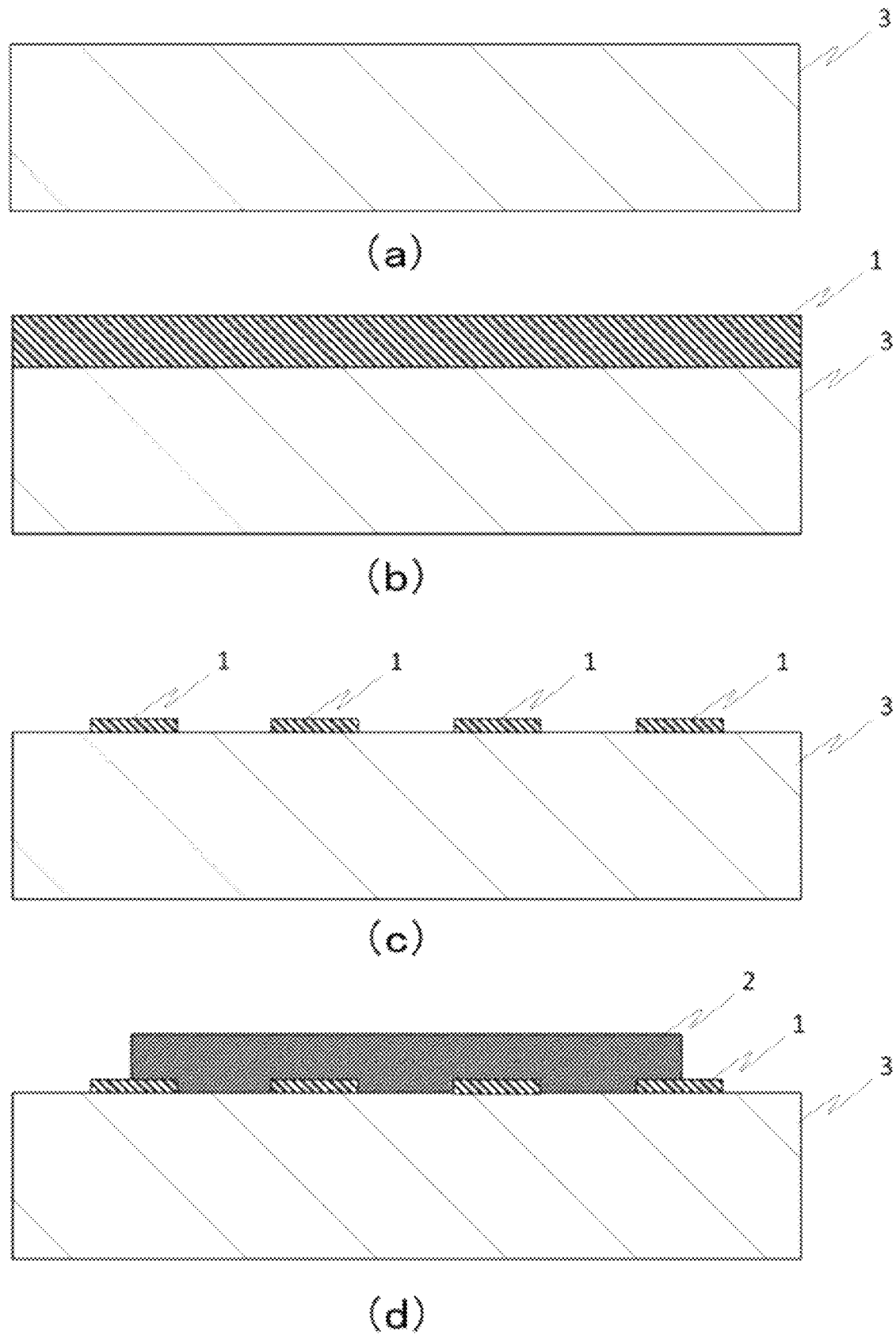
FIG. 2 is a schematic diagram illustrating a preferred method of fabricating a junction barrier Schottky diode (JBS) of FIG. 1.

Hereinafter, with reference to FIG. 2, a preferred manufacturing process and the like of the semiconductor device of FIG. 1 is described. FIG. 2(a) illustrates a semiconductor substrate that is an n-type semiconductor layer 3. Forming a p-type oxide semiconductor containing gallium as a p-type semiconductor 1 by mist CVD, on the semiconductor substrate, to obtain a multilayer structure of FIG. 2(b). With respect to the obtained multilayer structure of FIG. 2(b), removing unnecessary parts by etching using photolithography, to obtain a multilayer structure of FIG. 2(c). After obtaining the multilayer structure of FIG. 2(c), forming a barrier electrode 2 on the p-type semiconductor 1 and the n-type semiconductor layer 3 by using the dry method (preferably vacuum evaporation or sputtering), to obtain a multilayer structure of FIG. 2(d). The multilayer structure of FIG. 2(d) has a structure where the p-type semiconductor 1 is embedded in the n-type semiconductor 3 and protrude into the barrier electrode 2, and thus, enables to further suppress an electric field concentration and reduce a contact resistance, and thus, particularly useful for semiconductor devices of enhanced withstand voltage.

Figure 3:
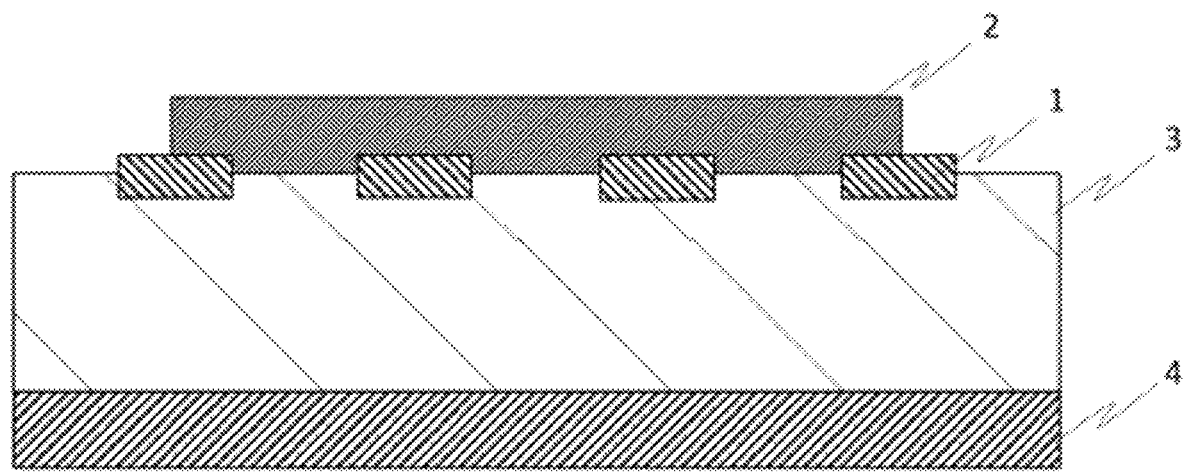
FIG. 3 is a schematic diagram illustrating a preferred embodiment of a junction barrier Schottky diode (JBS) according to the disclosure.

FIG. 3 illustrates a junction barrier Schottky diode (JBS) according to a preferred embodiment of the disclosure. The semiconductor device of FIG. 3 includes an n-type semiconductor layer 3, a barrier electrode 2 that is provided on the n-type semiconductor layer 3 and capable of forming a Schottky barrier with the n-type semiconductor layer, and a p-type semiconductor (one or more p-type semiconductors) 1 that is provided between the barrier electrode 2 and the n-type semiconductor layer 3 and capable of forming a Schottky barrier with the n-type semiconductor layer. Here, barrier height at an interface between the p-type semiconductor 1 and the n-type semiconductor layer 3 is higher than barrier height at an interface between the barrier electrode 2 and the n-type semiconductor layer 3. The p-type semiconductor 1 is embedded in the semiconductor region 3, and protrude from the n-type semiconductor layer 3 into the barrier electrode 2. According to one or more embodiments of the disclosure, the p-type semiconductor is preferably provided at regular intervals, and is more preferably provided respectively between the n-type semiconductor layer and both ends of the barrier electrode. Such a preferable embodiment enables a JBS with excellent semiconductor properties such as enhanced thermal stability and adhesion, further reduced current leakage, further suppressed electric field concentration, and further reduced contact resistance. The semiconductor device of FIG. 3 further includes an Ohmic electrode 4 that is provided on an opposite side of the n-type semiconductor 3 to the barrier electrode 2.

Examples of a method of forming each layer of the semiconductor device of FIG. 3 includes the above-described method of forming each layer.

Figure 4:
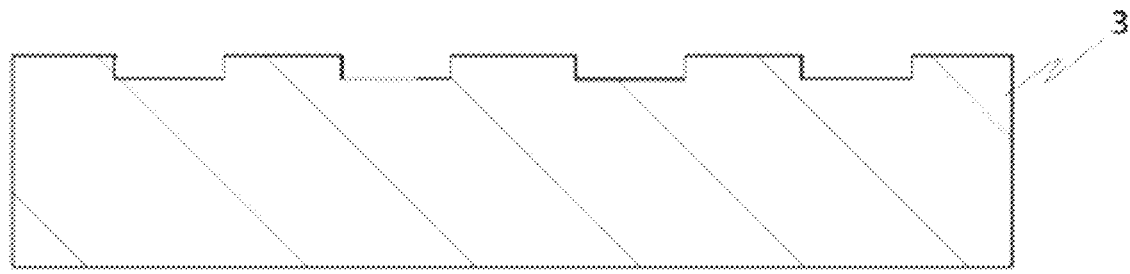
FIG. 4 is a schematic diagram illustrating a preferred method of fabricating a junction barrier Schottky diode (JBS) of FIG. 3.
Figure 4:
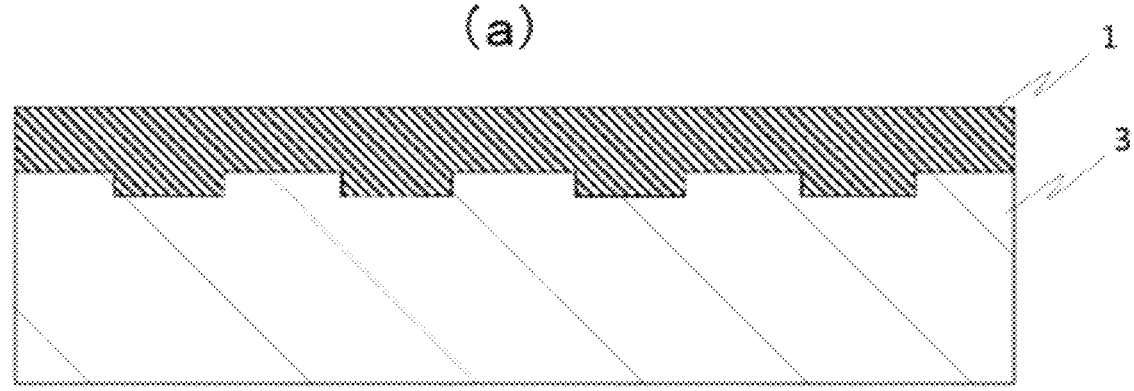
Figure 4:
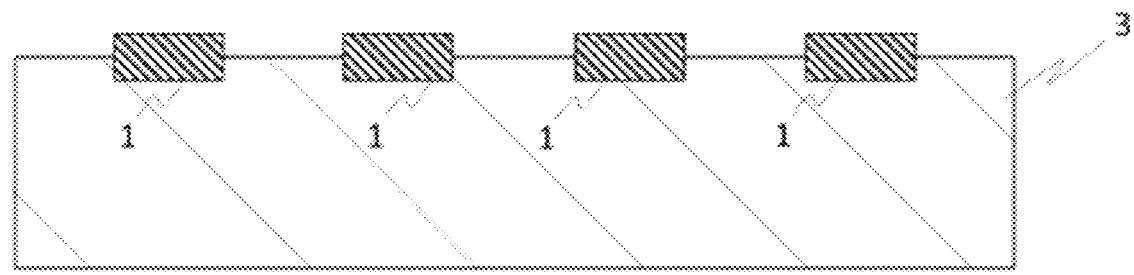
Figure 4:
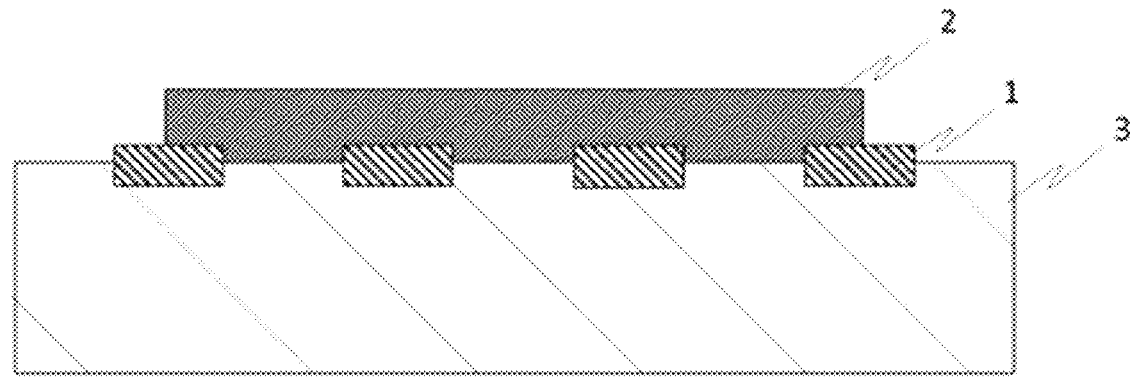

Hereinafter, with reference to FIG. 4, a preferred manufacturing process and the like of the semiconductor device of FIG. 3 is described. FIG. 4(a) illustrates a multilayer structure including a semiconductor substrate that is an n-type semiconductor layer 3 and two or more trenches formed on a surface of the n-type semiconductor layer 3. Forming a p-type oxide semiconductor containing gallium as a p-type semiconductor (one or more p-type semiconductors) 1 by mist CVD method, on the semiconductor substrate, to obtain a multilayer structure of FIG. 4(b). With respect to the obtained multilayer structure of FIG. 4(b), removing unnecessary parts by etching using photolithography, to obtain a multilayer structure illustrated in FIG. 4(c). After obtaining the multilayer structure of FIG. 4(c), forming a barrier electrode 2 on the p-type semiconductor 1 and the n-type semiconductor layer 3 by using the dry method (preferably vacuum evaporation or sputtering) or the wet method, to obtain a multilayer structure of FIG. 4(d). The multilayer structure of FIG. 4(d) has a structure where the p-type semiconductor 1 is embedded in the n-type semiconductor layer 3 and protrude into the barrier electrode 2, and thus, enables to further suppress an electric field concentration and reduce a contact resistance, and thus, particularly useful for semiconductor devices of enhanced withstand voltage.

Figure 20:
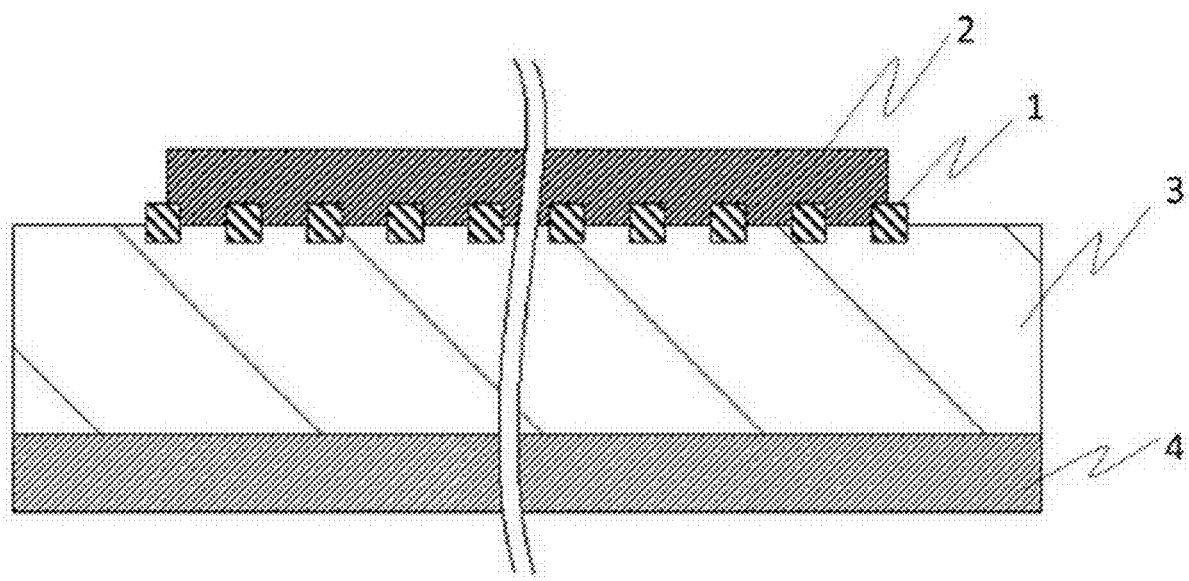
FIG. 20 is a schematic diagram illustrating a preferred embodiment of a junction barrier Schottky diode (JBS) according to an embodiment.

FIG. 20 illustrates a junction barrier Schottky diode (JBS) according to a preferred embodiment of the disclosure. A semiconductor device of FIG. 20 differs from the semiconductor device of FIG. 3 in that the 10 or more p-type semiconductors 1 are provided. According to an embodiment of the disclosure, it is preferable that 40 or more p-type semiconductors are provided. Such a preferable embodiment enables to further enhance withstand voltage of the semiconductor device.

Figure 5:
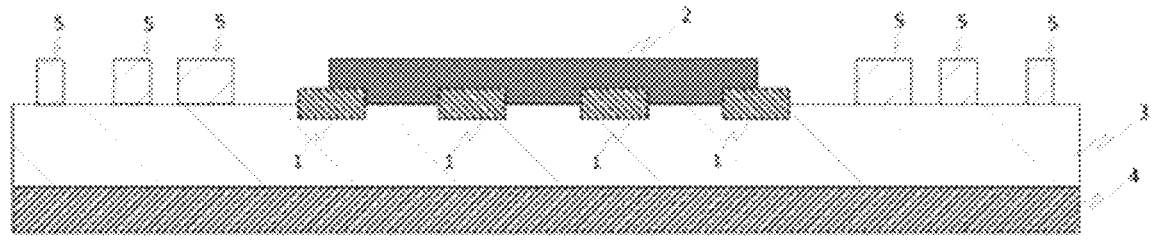
FIG. 5 is a schematic diagram illustrating a preferred embodiment of a junction barrier Schottky diode (JBS) according to the disclosure.
Figure 7:
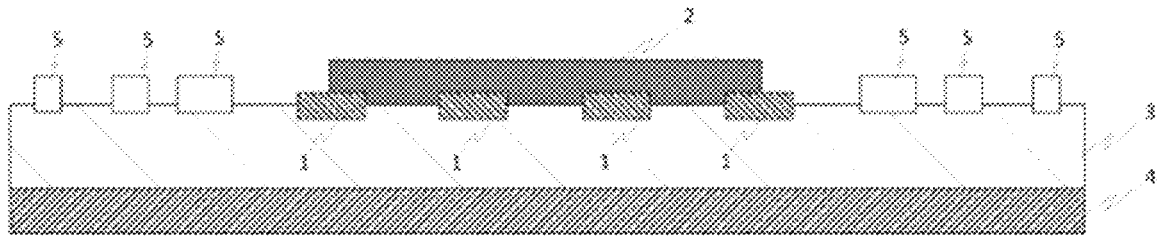
FIG. 7 is a diagram illustrating a preferred embodiment of a junction barrier Schottky diode (JBS) according to the disclosure.

FIG. 5 illustrates a junction barrier Schottky diode (JBS) according to a preferable embodiment of the disclosure. The semiconductor device of FIG. 5 differs from the semiconductor device of FIG. 3 in that a guard ring 5 is provided on an outer peripheral portion of a barrier electrode. This configuration of the semiconductor device of FIG. 5 enables the semiconductor device with enhanced semiconductor characteristics such as withstand voltage. According to one or more embodiments of the disclosure, by respectively embedding a portion of the guard ring 5 into a surface of the semiconductor region 3 as illustrated in FIG. 7, it is possible to make a withstand voltage further enhanced more effectively. Further, by using a metal with high barrier height as the guard ring, it is possible to provide the guard ring industrially advantageously together with a formation of the barrier electrode without significantly affecting the n-type semiconductor layer, so that the guard ring can be formed without deteriorating an on-resistance.

A material with high barrier height is in general used as the guard ring. Examples of the material used as the guard ring include a conductive material with barrier height of equal to or more than 1 eV. The material used as the guard ring may be the same material as the electrode material described above. According to one or more embodiments of the disclosure, the material used in the guard ring is preferably the above-mentioned metal, for a reason that larger flexibility in a design of a withstand-voltage structure can be provided, a large number of guard rings can be provided, and a withstand voltage can be flexibly made improved. A shape of the guard ring is not particularly limited, but may be square-shape, circular, channel-shape, L-shape or band-shape. While a number of the guard rings is not particularly limited, a number of the guard rings may be preferably three or more and more preferably six or more. While the guard ring is provided on outer periphery of the semiconductor device that locates outer than the barrier electrode, according to an embodiment of the disclosure, the guard ring may be provided between the n-type semiconductor layer and the both ends of the Schottky electrode.

Figure 13:
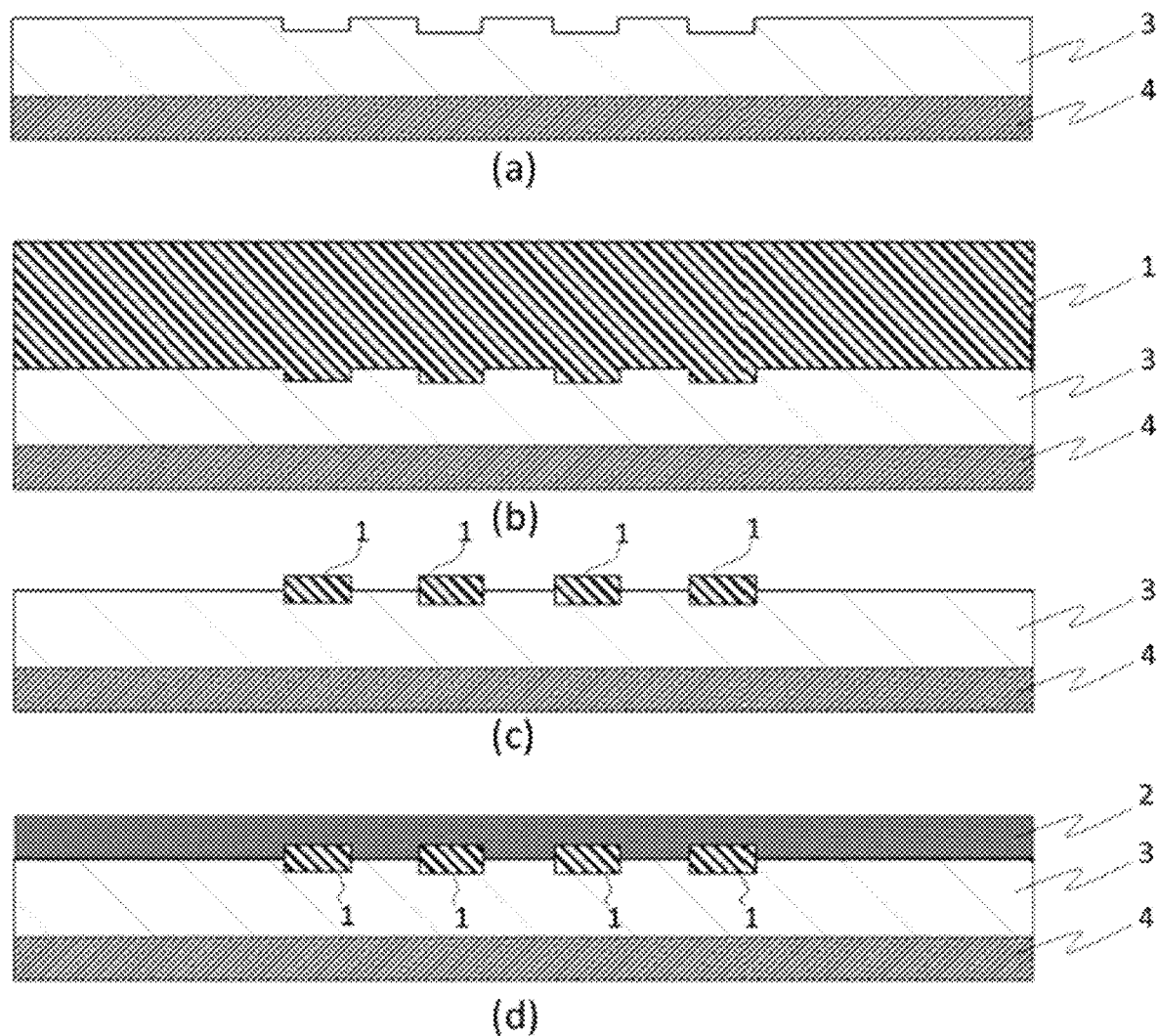
FIG. 13 is a diagram illustrating a preferred manufacturing method of the junction barrier Schottky diode (JBS) of FIG. 7.
Figure 14:
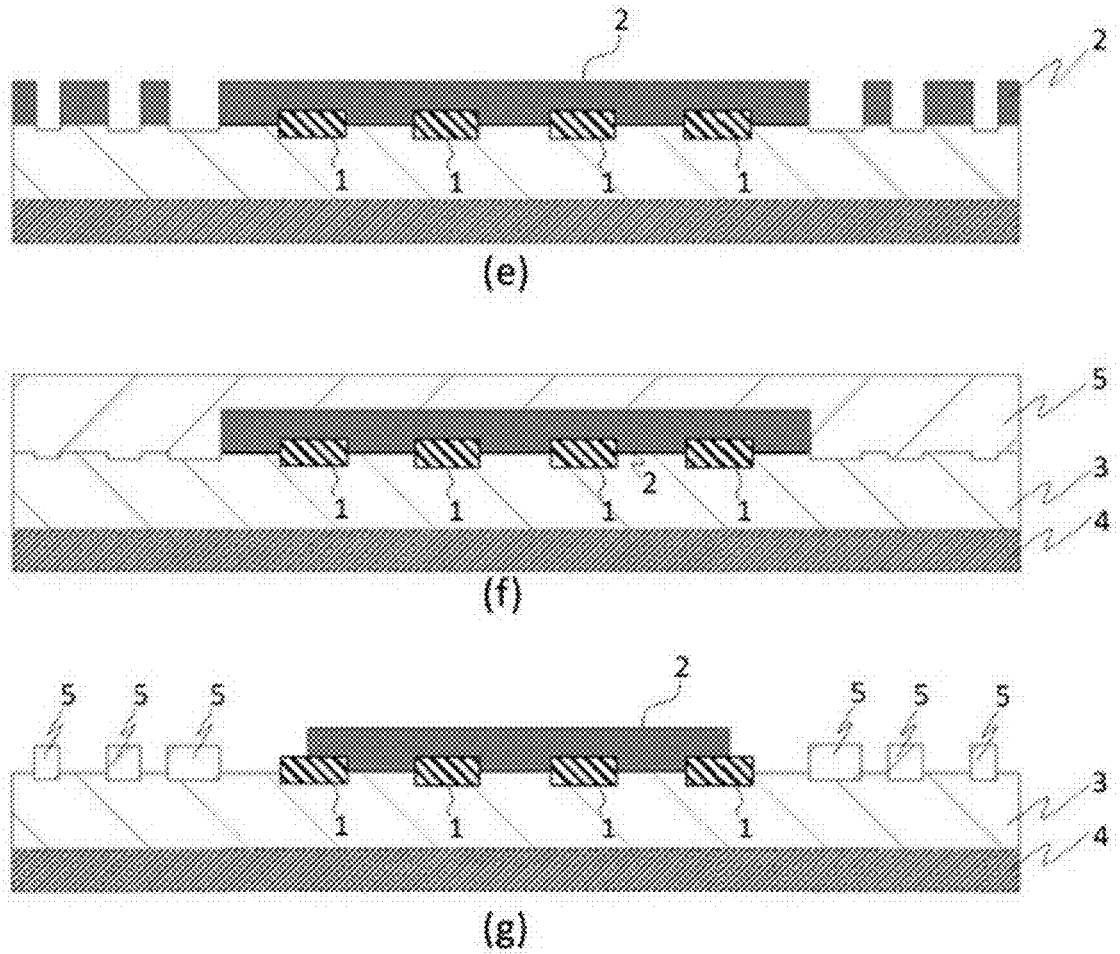
FIG. 14 is a diagram illustrating a preferred manufacturing method of the junction barrier Schottky diode (JBS) of FIG. 7.

Hereinafter, with reference to FIG. 13 and FIG. 14, a preferred manufacturing process and the like of the semiconductor device of FIG. 7 is described. FIG. 13(a) illustrates a multilayer structure including a semiconductor substrate that is an n-type semiconductor layer 3, an Ohmic electrode 4 arranged on the semiconductor substrate, two or more trenches formed on a surface of the semiconductor substrate that is opposite to the Ohmic electrode of the semiconductor substrate. After forming a p-type semiconductor 1 on the n-type semiconductor 3 of the multilayer structure of FIG. 13(a) using a photolithography as illustrated in FIG. 13(b), exposing the n-type semiconductor layer, as illustrated in FIG. 13(c). The multilayer structure of FIG. 13(b) and FIG. 13(c) includes the p-type semiconductor 1, the n-type semiconductor layer 3, and the Ohmic electrode 4. After obtaining the multilayer structure of FIG. 13(c), forming a barrier electrode 2 on the p-type semiconductor 1 and the n-type semiconductor layer 3 by using the dry method (preferably vacuum evaporation or sputtering) or the wet method, to obtain a multilayer structure of FIG. 13(d).

Then, removing a part of the barrier electrode 2 and a part of the semiconductor region 3 of the multilayer structure of FIG. 13(d) by etching using photolithography, as illustrated in FIG. 14(e). After obtaining the multilayer structure of FIG. 14(e), forming a guard ring 5 on the exposed portion of semiconductor region 3 by using the dry method (preferably vacuum evaporation or sputtering) or the wet method, to obtain a multilayer structure of FIG. 14(f). The multilayer structure of FIG. 14(f) includes the guard ring 5, the barrier electrode 2, the p-type semiconductor 1, the semiconductor region 3 and the Ohmic electrode 4. After obtaining the multilayer structure of FIG. 14(f), removing unnecessary parts by etching using photolithography, to obtain a multilayer structure of FIG. 14(g). The multilayer structure of FIG. 14(g) has the p-type semiconductor 1 that is embedded in the semiconductor region 3 and the guard ring 5 that is embedded in the peripheral portion of the n-type semiconductor layer 3, and thus, is further excellent in withstand voltage and the like.

In the above description, the guard ring 5 is formed at the end of the process, however, according to one or more embodiments of the disclosure, it is also preferable to forming the guard ring 5 prior to form the barrier electrode 2, for a reason that it is possible to suppress affecting by metal at the time of forming electrodes.

Figure 6:
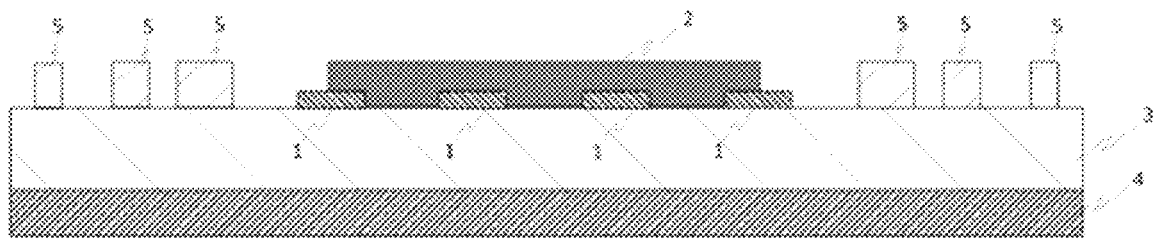
FIG. 6 is a schematic diagram illustrating a preferred embodiment of a junction barrier Schottky diode (JBS) according to the disclosure.
Figure 8:
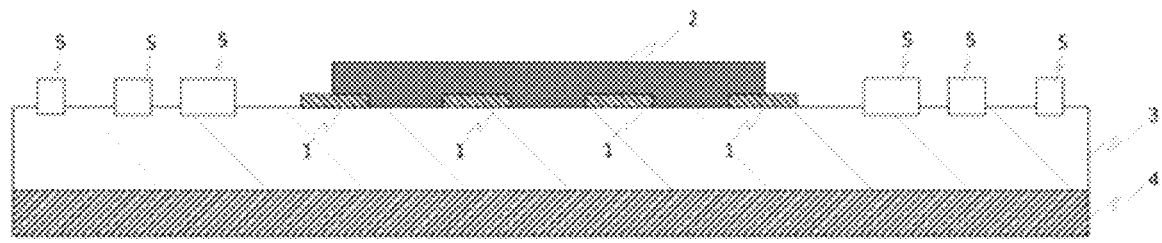
FIG. 8 is a schematic diagram illustrating a preferred embodiment of a junction barrier Schottky diode (JBS) according to the disclosure.

FIG. 6 illustrates a junction barrier Schottky diode (JBS) according to one or more embodiments of the disclosure. The semiconductor device of FIG. 6 differs from the semiconductor device of FIG. 1 in that a guard ring 5 is provided on an outer peripheral portion of a barrier electrode. This configuration of the semiconductor device of FIG. 6 enables the semiconductor device with enhanced semiconductor characteristics such as withstand voltage. According to one or more embodiments of the disclosure, by respectively embedding a portion of the guard ring 5 into a surface of the n-type semiconductor layer 3 as illustrated in FIG. 8, it is possible to make a withstand voltage further enhanced more effectively. Further, by using a metal with high barrier height as the guard ring, it is possible to provide the guard ring industrially advantageously together with a formation of the barrier electrode without significantly affecting the n-type semiconductor layer, so that the guard ring can be formed without deteriorating an on-resistance.

The semiconductor device is particularly useful for power devices. Examples of the semiconductor device include a diode or transistor (e.g., MESFET, etc.). Among all, a diode is preferable and a junction barrier Schottky diode (JBS) is more preferable.

In addition, the semiconductor device according to the disclosure may be used as a power module, an inverter, and/or a converter in combination with a known structure. Also, a semiconductor device according to the disclosure may be used in a semiconductor system including a power source, to which the semiconductor device may be electrically connected by a known structure and/or method. The semiconductor device may be electrically connected to a wiring pattern in the semiconductor system.

Figure 9:
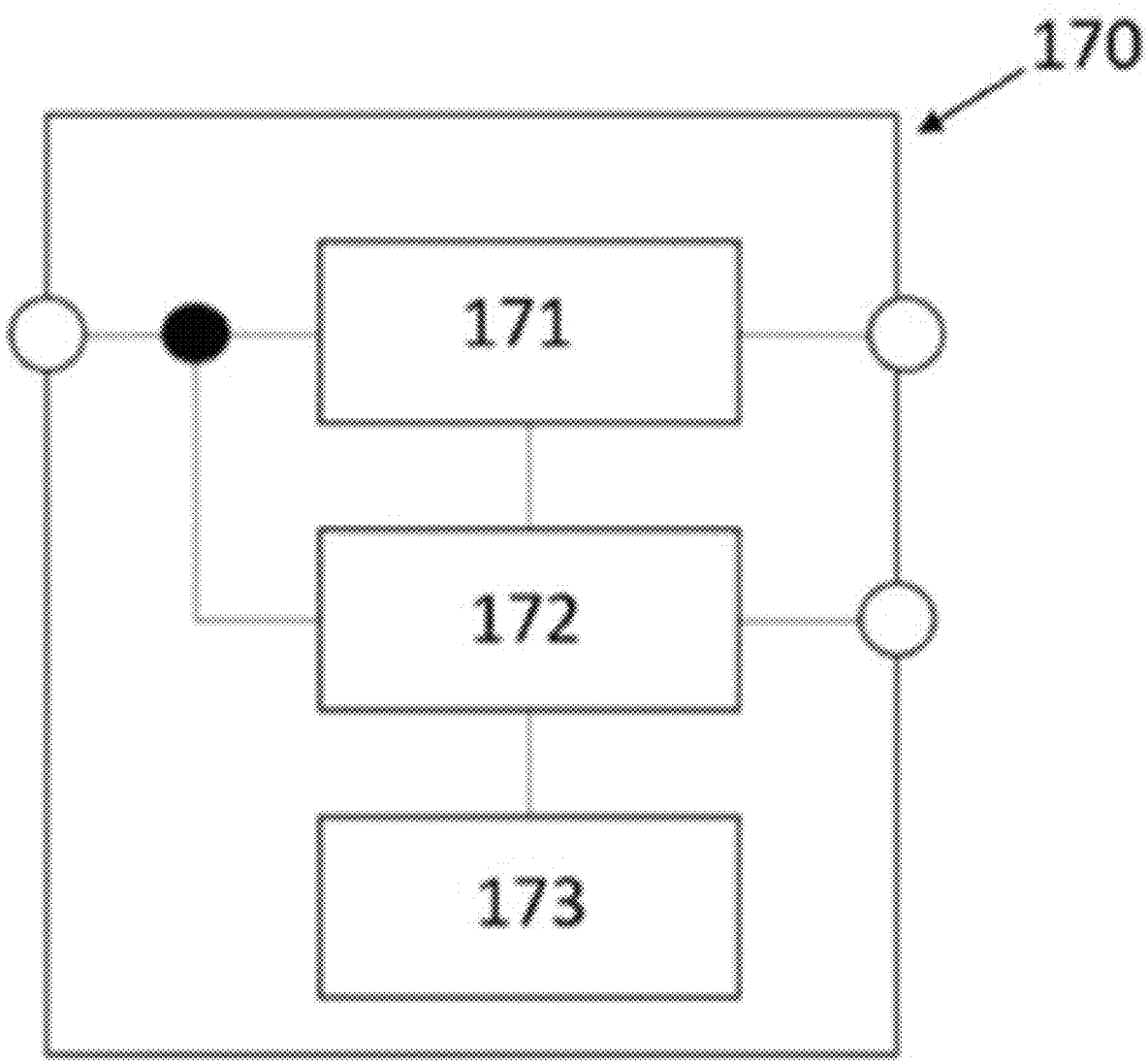
FIG. 9 is a schematic diagram illustrating a preferred embodiment of a power supply system.
Figure 10:
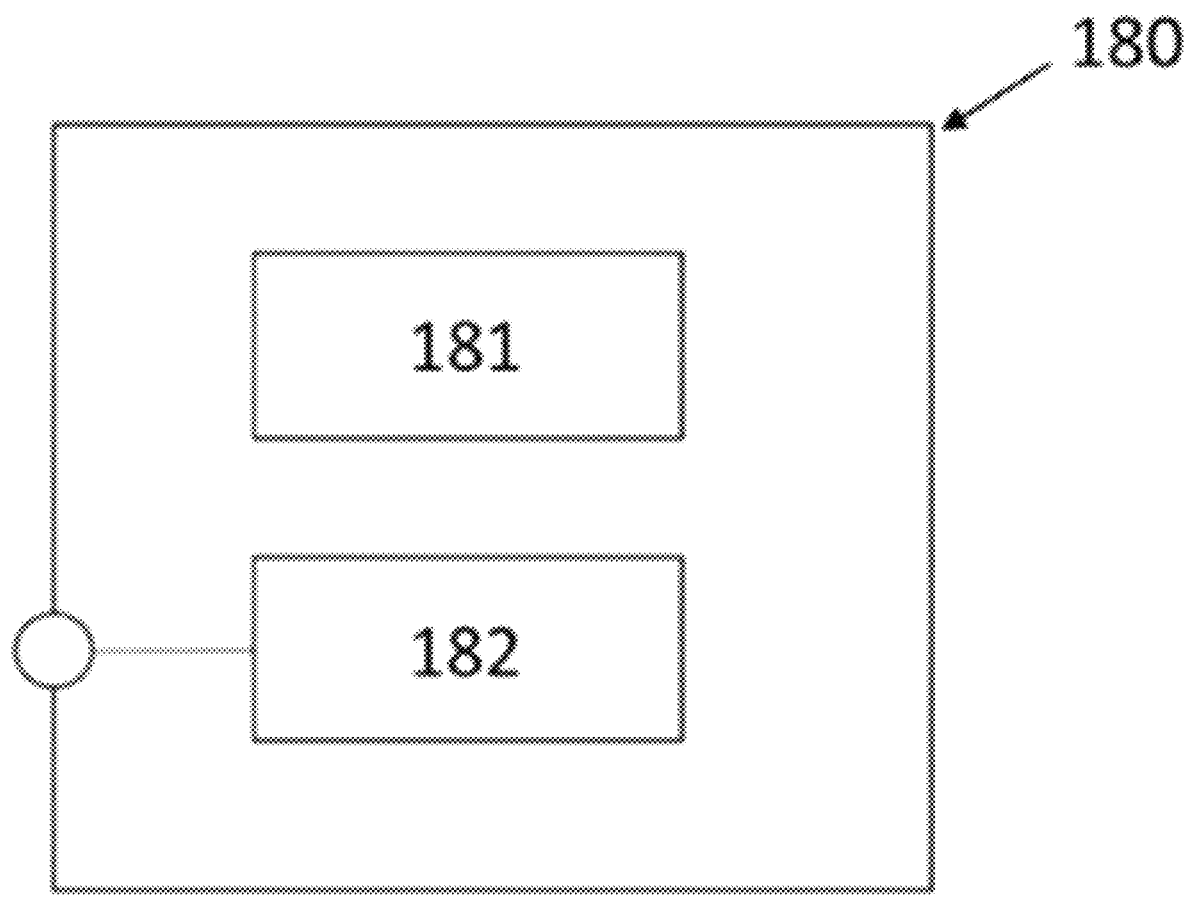
FIG. 10 is a schematic diagram illustrating a preferred embodiment of a system device.
Figure 11:
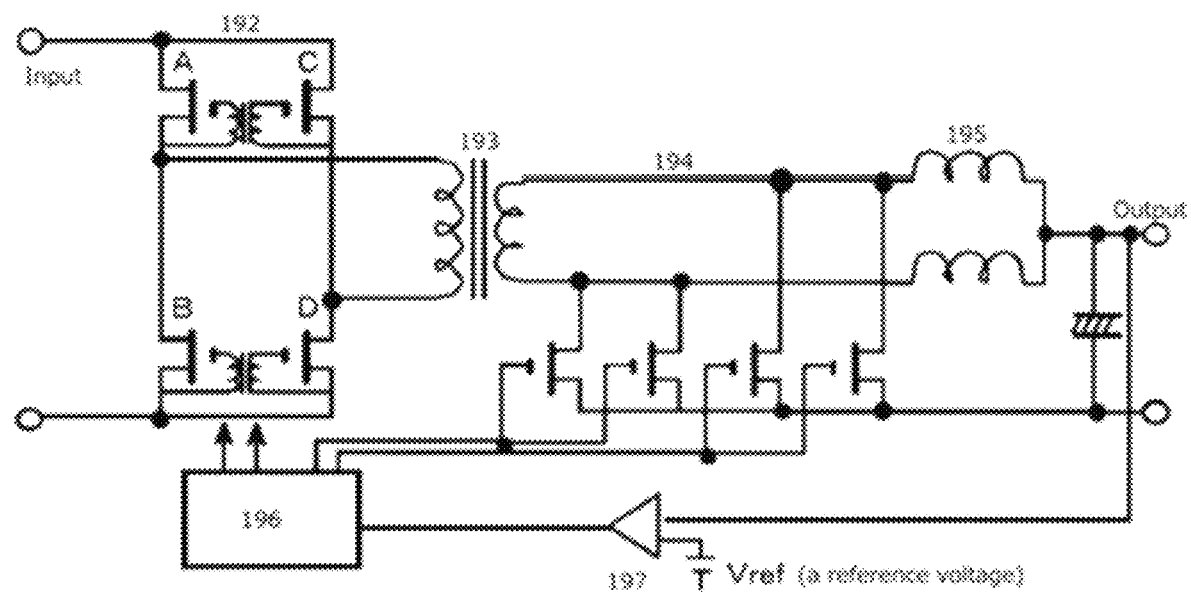
FIG. 11 is a schematic diagram illustrating a preferred embodiment of a power supply circuit diagram of the power supply.

FIG. 9 is a schematic view of a circuit diagram illustrating a power source system according to one or more embodiments of the disclosure. FIG. 9 illustrates a schematic view of the power source system using two or more power source devices and a control circuit. The power source system is, as illustrated in FIG. 10, used for a system device in combination with a circuit diagram. Also, FIG. 11 illustrates a power source circuit of a power source device, including a power circuit and a control circuit. A DC voltage is switched at high frequencies by an inverter (configured with MOSFET A to D) to be converted to AC, followed by insulation and transformation by a transformer. The voltage is then rectified by a rectification MOSFET and then smoothed by a DCL (smoothing coils L1 and L2) and a capacitor to output a direct current voltage. At this point, the output voltage is compared with a reference voltage by a voltage comparator to control the inverter and the rectification MOSFETs by a PWM control circuit to have a desired output voltage.

EXAMPLE

Reference Example 1

Adjusting Barrier Height by Using a p-Type Semiconductor

Figure 12:
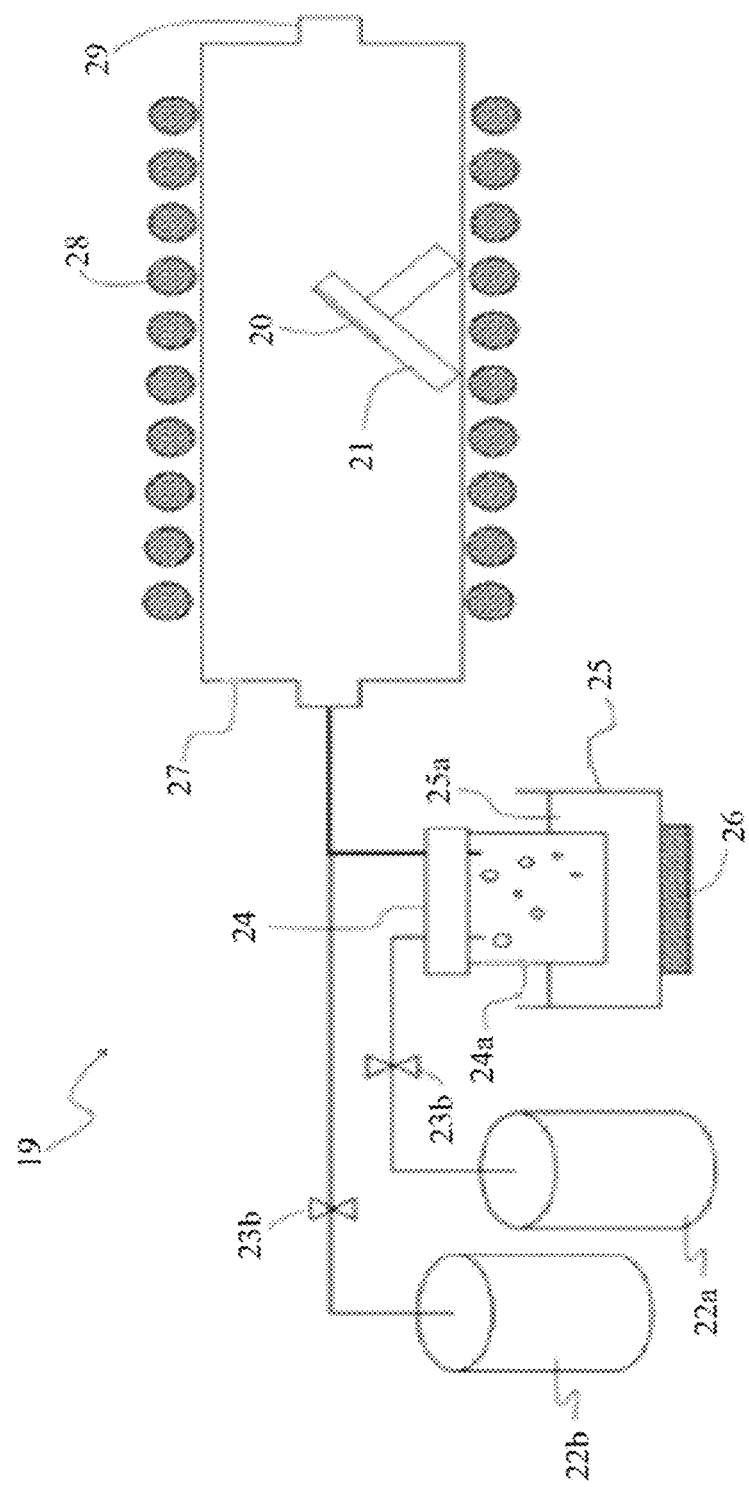
FIG. 12 is a schematic configuration diagram illustrating an embodiment of a deposition apparatus (mist CVD apparatus) used in the reference example.

In a reference example 1, an adjustment of barrier height by using a p-type semiconductor was evaluated.
1-1. Deposition of a p-Type Semiconductor Layer
1-1-1. Deposition Apparatus With reference to FIG. 12, a mist CVD apparatus 19 used in a reference example is described. The mist CVD apparatus 19 includes a susceptor 21 on which a substrate 20 is placed, a carrier gas supply device 22a to supply a carrier gas, a flow control valve 23a that is configured to control a flow rate of the carrier gas supplied from the carrier gas supply device 22a, a carrier gas (diluted) supply device 22b to supply a carrier gas (diluted), a flow control valve 23b that is configured to control a flow rate of the carrier gas supplied from the carrier gas (diluted) supply device 22b, a mist generator 24 containing a raw material solution 24a, a container 25 containing water 25a, an ultrasonic transducer 26 attached to a bottom of the container 25, a supply pipe 27 made of a quartz tube having an inner diameter of 40 mm, and a heater 28 arranged at a peripheral portion of the supply pipe 27. The susceptor 21 is made of quartz. The susceptor 21 includes a surface that is slanted off the horizontal and on that the substrate is arranged. Since the susceptor 21 and the supply pipe 27 that is configured to be a deposition chamber are made of quartz, impurities from the device that is introduced into a film formed on the substrate 20 is suppressed.

1-1-2. Preparation of a Raw Material Solution

Gallium bromide and magnesium bromide were mixed in ultrapure water to be a raw material solution such that the atomic ratio of magnesium to gallium is 1:0.01 and gallium bromide is 0.1 mol/L, and the raw material solution contains hydrohalic acid to be 20% by volume ratio.

1-1-3. Deposition Preparation

The raw material solution 24a obtained at 1-1-2. was set in the mist generator 24. Then, as the substrate 20, a sapphire substrate, that has an n+-type semiconductor layer ($\alpha$-$Ga_2O_3$) formed by mist CVD on its surface, was placed on the susceptor 21, and the heater 28 was activated to raise a temperature in the deposition chamber 27 up to 520° C. The flow control valves 23a and 23b were opened to supply a carrier gas from the carrier gas supply devices 22a and 22b that are carrier gas source into the deposition chamber 27 to replace an atmosphere in the deposition chamber with the carrier gas. After the atmosphere in the deposition chamber 27 was sufficiently replaced with the carrier gas, a flow rate of the carrier gas was adjusted at 1 L/min and a flow rate of the carrier gas (diluted) was adjusted at 1 L/min. In this embodiment, nitrogen was used as the carrier gas.

1-1-4. Deposition of a Semiconductor Film

The ultrasonic transducer 26 was then vibrated at 2.4 MHz, and the vibration propagated through the water 25a to the raw material solution 24a, to atomize the raw material solution 24a to form a mist. The mist was introduced into the deposition chamber 27 by the carrier gas. The mist reacted at 520° C. under an atmospheric pressure to deposit a semiconductor film on the substrate 20. A deposition time was 60 minutes.

1-1-5. Evaluation

The obtained film at 1-1-4. was identified by X-ray diffraction device and revealed to be $\alpha$-$Ga_2O_3$.

1-2. Evaluation

Figure 15:
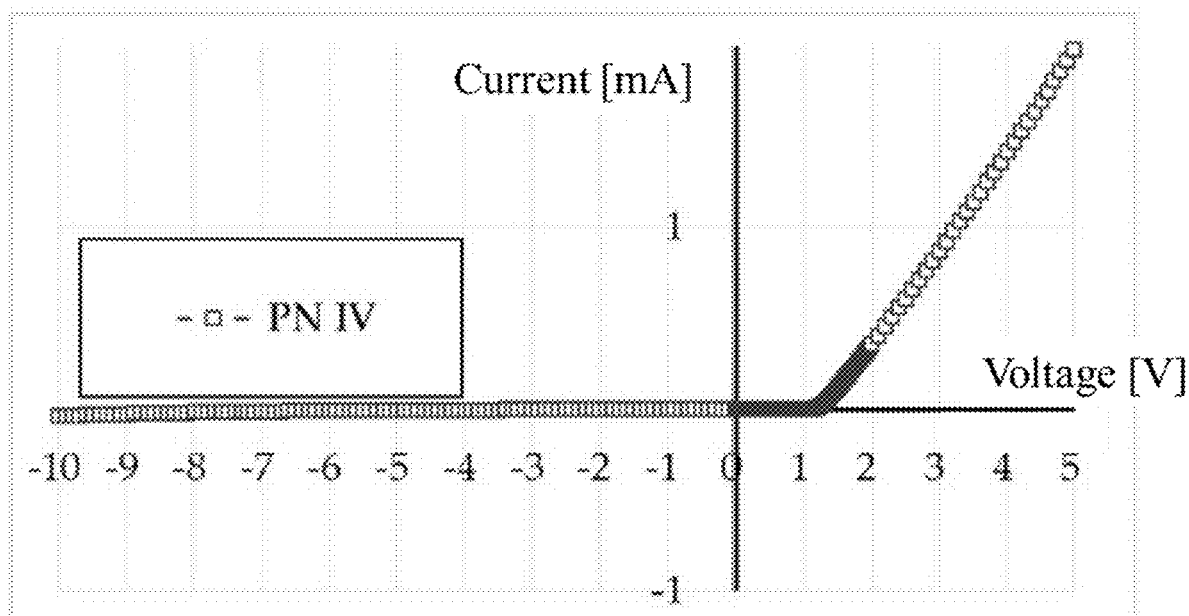
FIG. 15 is a diagram illustrating the results of I-V measurement in the reference example.

In order to confirm whether magnesium works properly as a p-type dopant in a p-type semiconductor layer, I-V measurement was conducted on the $\alpha$-$Ga_2O_3$ film obtained in at 1-1. The result is illustrated in FIG. 15. As apparent from FIG. 15, excellent rectifying property was observed and the n+-type semiconductor layer and the p-type semiconductor layer formed a good PN junction. Since magnesium works properly as a p-type dopant it was revealed that barrier height may be adjusted by forming a p-type semiconductor.

Reference Example 2

Adjusting Barrier Height by Using a p-Type Semiconductor

In a reference example 2, an adjustment of barrier height by using a p-type semiconductor was evaluated.

2-1. Deposition of a p-Type Semiconductor Layer 2-1-1. Deposition Apparatus

Figure 19:
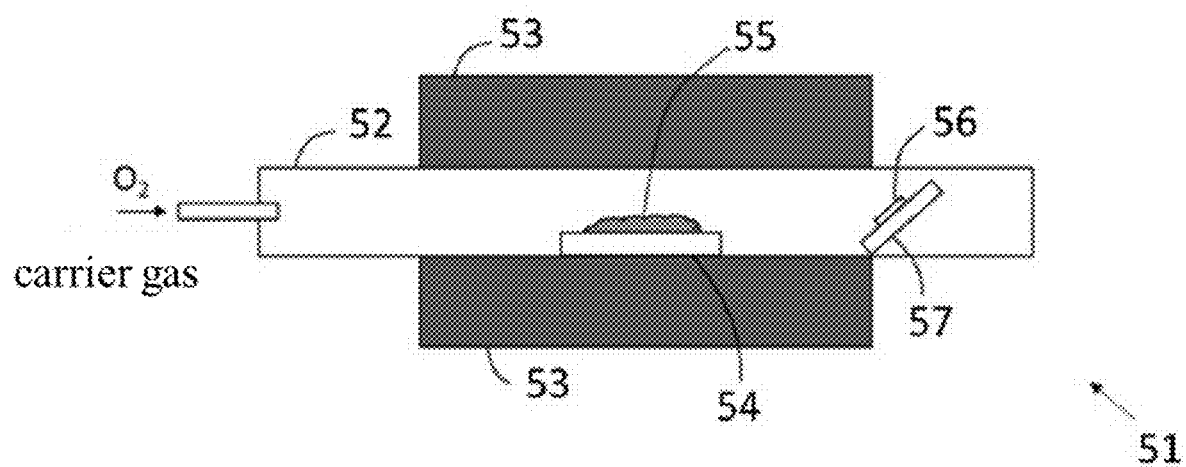
FIG. 19 is a schematic configuration diagram illustrating an embodiment of the deposition apparatus used for forming a p-type semiconductor.

With reference to FIG. 19, a deposition apparatus used in this embodiment is described. The deposition apparatus 51 illustrated in FIG. 19 includes a quartz cylinder 52 that is connected to a carrier gas supply source, and a quartz raw material mount 54 that is provided in the quartz cylinder 52. The raw material 55 is placed on the raw material mount 54. A cylindrical heater is provided on an outer cylinder of the quartz cylinder 52 around the raw material installation mount and is configured to be able to heat the raw material 55. Further, a quartz substrate base is provided as a susceptor 57 in the deep inside of the quartz cylinder 52, and the position of the susceptor 57 is adjusted so that the susceptor 57 is within the crystal growth temperature.

2-1-2. Preparation for Deposition

As a raw material 5, $IrO_2$ powder was placed on the raw material mount 4, and as a substrate 6, a sapphire substrate was placed on the susceptor 7. Next, a temperature of the heater 3 was raised up to 850° C., and by heating $IrO_2$ powder placed on the raw material mount 4 sublimating $IrO_2$ powder to produce a gaseous iridium oxide.

2-1-3. Deposition

A carrier gas was supplied into the quartz cylinder 52 from a carrier gas supply source while maintaining the temperature of the heater 53 at 850° C., to supply the metal oxide gas (gaseous iridium oxide) generated in the above 52. to the substrate 56 through the quartz cylinder 52. The flow rate of the carrier gas was 1.0 L/min, and oxygen was used as the carrier gas. The metal oxide gas was reacted in a vicinity of a surface of the substrate 6 under atmospheric pressure, and a film was formed on the substrate. A deposition time was 120 minutes.

2-2. Evaluation

The obtained film at 2-1. was identified by X-ray diffraction device and revealed to be $\alpha$-$Ir_2O_3$. After forming an n--type semiconductor layer ($\alpha$-$Ga_2O_3$) and an n+-type semiconductor layer ($\alpha$-$Ga_2O_3$) by mist CVD method, I-V measurement was conducted. As a result, excellent rectifying property was observed and the n+-type semiconductor layer and the p-type semiconductor layer formed a good PN junction. Since magnesium works properly as a p-type dopant it was revealed that barrier height may be adjusted by forming a p-type semiconductor.

Example 1

Fabrication of JBS Diode

1. Formation of an n+-type Semiconductor Layer 1-1. Deposition Apparatus

Figure 16:
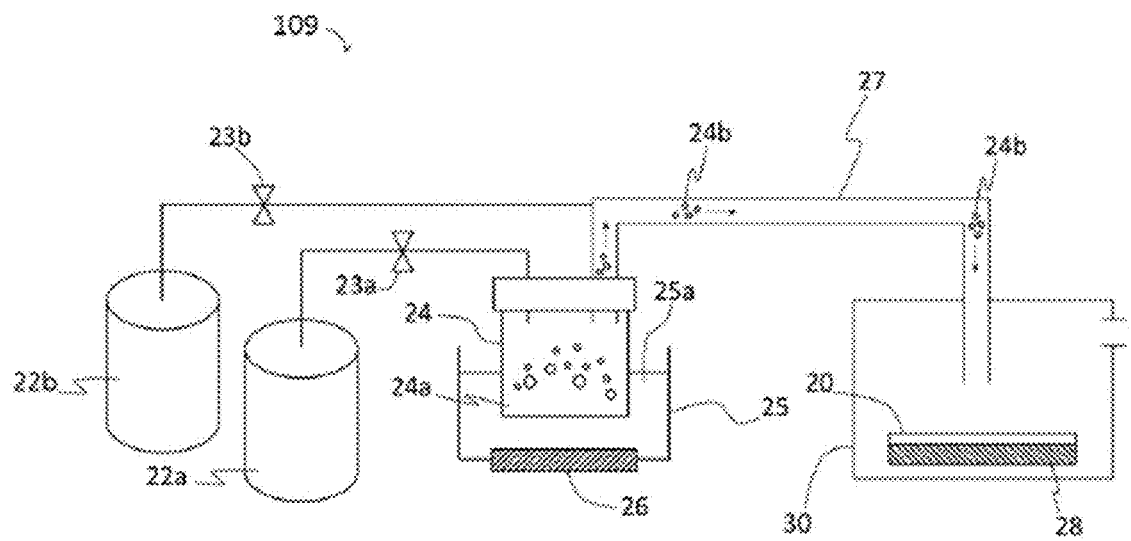
FIG. 16 is a schematic configuration diagram illustrating an embodiment of the deposition apparatus (mist CVD apparatus) used in the example.

With reference to FIG. 16, a mist CVD apparatus 109 used in this example will be descibed. The mist CVD apparatus 109 includes a carrier gas supply device 22a to supply a carrier gas, a flow control valve 23a that is configured to control a flow rate of the carrier gas supplied from the carrier gas supply device 22a, a carrier gas (diluted) supply device 22b to supply a carrier gas (diluted), a flow control valve 23b that is configured to control a flow rate of the carrier gas supplied from the carrier gas (diluted) supply device 22b, a mist generator 24 containing a raw material solution 24a, a container 25 containing water 25a, an ultrasonic transducer 26 attached to a bottom of the container 25, a deposition chamber 30, a quartz supply pipe connecting from the mist generator 24 to the deposition chamber 30, and a hot plate (heater) 28 arranged in the deposition chamber 30. A substrate 20 may be set on the hot plate 28. A substrate 20 may be set on the hot plate 28.

1-2. Preparation of a Raw Material Solution

Tin bromide was mixed to a 0.1 M aqueous gallium bromide solution, and the aqueous gallium bromide solution containing tin bromide was prepared to have an atomic ratio of tin to gallium that is 1:0.12, and at this point, hydrobromic acid was contained in the aqueous gallium bromide solution containing tin bromide to have a volume ratio of 15% of the aqueous solution that would be a raw-material solution.

1-3. Preparation for Film Formation

The raw material solution 24a obtained at 2. was set in the mist generator 24. Then, as the substrate 20, an m-plane sapphire substrate that has an undoped $\alpha$-$Ga_2O_3$ buffer layer on its surface was placed on the hot plate 28, and the hot plate 28 was activated to raise a temperature of the substrate up to 600° C. The flow control valve 23a and 23b were opened to supply a carrier gas from the carrier gas supply device 22a and 22b that are the carrier gas source into the deposition chamber 30 to replace the atmosphere in the deposition chamber 30 with the carrier gas. After the atmosphere in the deposition chamber 30 is sufficiently replaced with the carrier gas, a flow rate of the carrier gas was regulated at 1.0 L/min and the flow rate of the diluted carrier gas was regulated at 1.0 L/min. In this embodiment, nitrogen was used as the carrier gas.

1-4. Deposition

The ultrasonic transducer 26 was then vibrated at 2.4 MHz, and the vibration propagated through the water 25a to the raw material solution 24a to atomize the raw material solution 24a to form a mist (atomized droplets) 24b. The mist 24b was introduced in the film deposition chamber 30 by the carrier gas through the supply pipe 27. The mist was thermally reacted at 600° C. under atmospheric pressure to deposit a film on the substrate 20. A deposition time was one hour. The obtained film was identified by X-ray diffraction device, and revealed to be $\alpha$-$Ga_2O_3$ single-crystal film.

2. Formation of an n-Type Semiconductor Layer

An n--type semiconductor layer was formed on the n+-type semiconductor layer obtained at 1. by a method similarly to the method of 1. except the following conditions: gallium bromide was mixed to a ultra pure water to make a 0.1 M aqueous gallium bromide solution, and at this point, hydrobromic acid was contained in the aqueous gallium bromide solution to have a volume ratio of 10% of the aqueous solution that would be a raw-material solution; the film formation time was set to be 50 minutes. The obtained film was identified by X-ray diffraction device, and revealed to be $\alpha$-$Ga_2O_3$ single-crystal film. Here, the n--type semiconductor layer was formed to be patterned by using a mask, so that a part of the n+-type semiconductor layer is exposed.

3. Formation of a $SiO_2$ Mask Pattern

A mask pattern for embedded p-type semiconductor layer was formed by following steps: $SiO_{e2}$ film was deposited on the n--type semiconductor layer obtained at above 2; then, conducting photolithography and wet etching.

4. Formation of Embedded p-Type Semiconductors

A p-type semiconductor was formed on the mask pattern obtained at above 3. by a method similarly to the method of above 1. except the following conditions: magnesium bromide was mixed to a 0.1 M aqueous gallium bromide solution, and the aqueous gallium bromide solution containing tin bromide was prepared to have an atomic ratio of magnesium to gallium that is 1:0.1, and at this point, hydrobromic acid was contained in the aqueous gallium bromide solution containing magnesium bromide to have a volume ratio of 20% of the aqueous solution that would be a raw-material solution; the temperature of film formation was set to be 540° C.; the film formation time was set to be 50 minutes. Here, a p-type semiconductor located between both ends of the Schottky electrode and the n--type semiconductor layer was formed as a guard ring. The obtained p-type semiconductor was identified by X-ray diffraction device, and revealed to be $\alpha$-$Ga_2O_3$ single-crystal film.

5. Regrowth of the n-Type Semiconductor Layer

After removing $SiO_2$ mask pattern formed at the above 3. by etching, an n--type semiconductor layer was regrown so that a part of the p-type semiconductor obtained at the above 4. is embedded in the n--type semiconductor layer. The regrowth of the n--type semiconductor layer was conducted by a method similarly to the method of the above 2. except that the film formation time was set to be 25 minutes. A number of embedded p-type semiconductors was forty.

6. Formation of a Schottky Electrode

Co was formed as a Schottky electrode on the n--type semiconductor layer in which the p-type semiconductors were embedded. Here, the formation of Co was carried out by using EB evaporation. A film thickness of Co was 200 nm.

7. Formation of an Ohmic Electrode

Ti was formed as an Ohmic electrode on the n+-type semiconductor layer that was exposed at the above 2. Here, the formation of Ti was carried out by using EB deposition. A film thickness of Ti was 200 nm.

8. Cross-Sectional Observation

Figure 18:
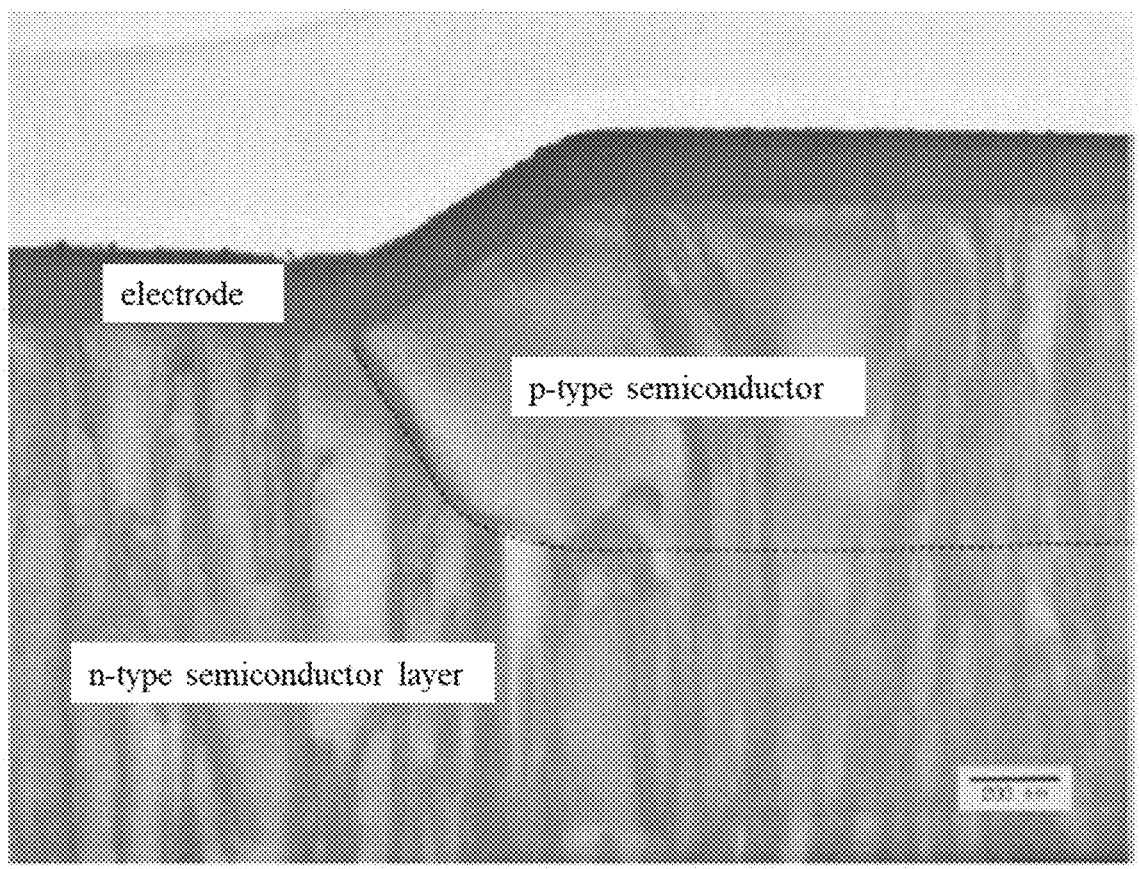
FIG. 18 is a diagram illustrating the results of TEM observation in the example.

A part of a cross section of the obtained JBS diode was observed by using TEM. As apparent from FIG. 18, the p-type semiconductors were embedded in the n-type semiconductor layer, and, the p-type semiconductors were found to protrude into the Schottky electrode. In addition, the p-type semiconductors included an excellent lateral-growth region.

Example 2

Fabrication of JBS

1. Formation of an n+-Type Semiconductor Layer

An n+-type semiconductor layer was formed by a method similarly to the method of above 1. in the example 1, except the following conditions: tin bromide was mixed to a 0.1 M aqueous gallium bromide solution, and the aqueous gallium bromide solution containing tin bromide was prepared to have an atomic ratio of tin to gallium that is 1:0.04, and at this point, hydrobromic acid was contained in the aqueous gallium bromide solution containing tin bromide to have a volume ratio of 15% of the aqueous solution that would be a raw-material solution; the film formation time was set to be 10 minutes. The obtained film was identified by X-ray diffraction device, and revealed to be $\alpha$-$Ga_2O_3$ single-crystal film.

2. Formation of an n--Type Semiconductor Layer

An n--type semiconductor layer was formed by a method similar to the method of above 2. in the example 1, except that the film formation time was set to be 20 minutes. The obtained film was identified by X-ray diffraction device, and revealed to be $\alpha$-$Ga_2O_3$ single-crystal film.

3. Formation of Grooves for Embedding p-Type Semiconductors

Using photolithography and dry etching, grooves for embedding p-type semiconductors were formed in the n--type semiconductor layer obtained in the above 2.

4. Formation of Embedded p-Type Semiconductors

P-type semiconductors were deposited by a method similar to the method of above 4. in the example 1, except that the deposition time was set to be 14 minutes. A number of p-type semiconductors embedded in the n--type semiconductor was 75.

5. Formation of a Schottky Electrode

A Schottky electrode was formed on the n--type semiconductor in which the p-type semiconductors were embedded by a method similar to the method of above 6. in the example 1.

6. Formation of an Ohmic Electrode

An ohmic electrode was formed on an exposed surface of the n+-type semiconductor layer by a method similar to the method of above 7. in the example 1. Here, the exposed surface was provided by etching.

7. Cross-Sectional Observation

A part of a cross section of the obtained JBS diode was observed in the same manner as in Example 1. The observation revealed that the p-type semiconductors were embedded in the n-type semiconductor layer, and the p-type semiconductors were protruded into the Schottky electrode. In addition, the p-type semiconductors included an excellent lateral-growth region.

Comparative Example 1

Fabrication of a Schottky Barrier Diode (SBD)

A SBD was fabricated by a method similar to the method of example 1, except that the formation of p-type semiconductors were not performed.

Comparative Example 2

Fabrication of JBS

A JBS was fabricated by a method similar to the method of example 1 except the following conditions: p-type semiconductors were formed not to protruded into the electrode; the two p-type semiconductors were formed.

(Evaluation)

Figure 17:
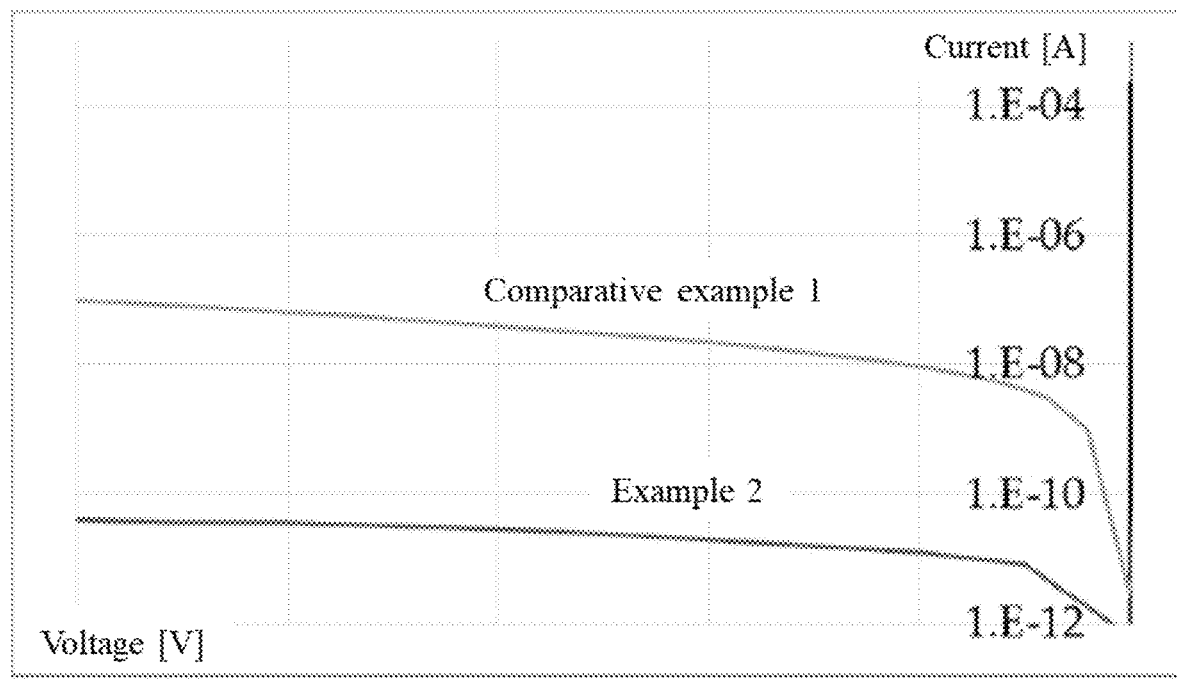
FIG. 17 is a diagram illustrating the results of I-V measurements in the example and the comparative example.

I-V measurement was performed regarding a JBS obtained in Example 2 and Comparative Example 1. The results are illustrated in FIG. 17. As apparent from FIG. 17, according to the JBS of Example 1, as compared with the SBD of Comparative Example 1, the electric field concentration is more suppressed. Also, the JBS of example 2 has more enhanced withstand voltage than the SBD of comparative example 1. Further, the results of the forward I-V measurement revealed that a contact resistance of JBS of example 2 is further reduced compared to a contact resistance of the SBD of comparative example 1. I-V measurement was performed regarding the JBS of Example 1 and revealed that the JBS of example 1 has the same electrical characteristics as the JBS of Example 2. Also, the JBS of Comparative Example 2 was found to have the same electrical characteristics as the SBD of Comparative Example 1.

INDUSTRIAL APPLICABILITY

The semiconductor device according to one or more embodiments of the disclosure can be used in various fields such as semiconductors (e.g., compound semiconductor electronic devices), electronic parts, electric equipment parts, optical electrophotographic related apparatus, industrial members, and especially useful for power devices.

REFERENCE NUMBER DESCRIPTION 1 p-type semiconductor
2 Electrode (barrier electrode)
3 n-type semiconducting layer
4 Ohmic electrode
5 guard ring
19 mist CVD apparatus
20 substrate
21 susceptor
22a carrier gas supply device
22b carrier gas (diluted) supply device
23a flow control valve
23b flow control valve
24 mist generator
24 raw material solution
25 container
25a water
26 ultrasonic transducer
27 supply pipe
28 heater (hot plate)
29 exhaust port
51 Deposition apparatus
52 quartz tube
53 heater
54 a quartz raw material mount
55 raw material
56 substrate
57 susceptor
109 mist CVD apparatus
170 Power source system
171 Power source device
172 Power source device
173 Control circuit
180 System device
181 Electric circuit
182 Power source system
192 Inverter
193 Transformer
194 MOSFET
195 DCL
196 PWM control circuit
197 Voltage comparator

What is claimed is:

1. A semiconductor device, comprising:
an n-type semiconductor layer;
two or more p-type semiconductors; and
an electrode, wherein
the n-type semiconductor layer includes a first oxide semiconductor as a major component,
the first oxide semiconductor contains a gallium,
the two or more p-type semiconductors are provided between the n-type semiconductor layer and the electrode,
at least a first part of the two or more p-type semiconductors is embedded in the n-type semiconductor layer,
at least a second part of the two or more p-type semiconductors is protruded in the electrode,
the two or more p-type semiconductors are in direct contact with at least a part of the n-type semiconductor layer,
the two or more p-type semiconductors contain a second oxide semiconductor and a p-type dopant, and
the p-type dopant includes one or more elements selected from Mg, Zn, Ca, H, Li, Na, K, Rb, Cs, Fr, Be, Sr, Ba, Ra, Mn, Fe, Co, Ni, Pd, Cu, Ag, Au, Cd, Hg, TI, Pb, N, and P,
a distance between adjacent p-type semiconductors in the two or more p-type semiconductors is in a range of from 0.125 µm to 4 µm, and
a depth of the two or more p-type semiconductor is in a range of from 0.125 µm to 4 µm.

2. The semiconductor device according to claim 1, wherein the second oxide semiconductor is a crystalline oxide semiconductor.

3. The semiconductor device according to claim 1, wherein the n-type semiconductor layer contains a crystalline oxide semiconductor having a corundum structure or a hexagonal structure as a major component.

4. The semiconductor device according to claim 1,
wherein the second oxide semiconductor contains one or more metals selected from Group 13 and Group 9 of the periodic table.

5. The semiconductor device according to claim 1,
wherein the second oxide semiconductor contains gallium.

6. The semiconductor device according to claim 1,
wherein the two or more p-type semiconductors are crystalline oxide semiconductors having a corundum structure or a hexagonal structure.

7. The semiconductor device according to claim 1,
wherein ten or more p-type semiconductors are provided between the n-type semiconductor layer and the electrode.

8. The semiconductor device according to claim 1,
wherein the two or more p-type semiconductors are epitaxially grown on the n-type semiconductor layer.

9. The semiconductor device according to claim 1,
wherein the two or more p-type semiconductors include a lateral-growth area.

10. The semiconductor device according to claim 1,
wherein the semiconductor device is a diode.

11. The semiconductor device according to claim 1,
wherein the semiconductor device is a Junction barrier Schottky diode.

12. The semiconductor device according to claim 1,
wherein the semiconductor device is a power device.

13. A semiconductor system, comprising:
a semiconductor device according to claim 1; and
a power system, wherein
the semiconductor device is integrated with the power system.

14. A semiconductor device, comprising:
an n-type semiconductor layer;
two or more p-type semiconductors; and
an electrode, wherein
the n-type semiconductor layer includes a first oxide semiconductor as a major component,
the first oxide semiconductor contains a gallium,
the two or more p-type semiconductors are provided between the n-type semiconductor layer and the electrode,
at least a first part of the two or more p-type semiconductors is embedded in the n-type semiconductor layer,
at least a second part of the two or more p-type semiconductors is protruded in the electrode,
the two or more p-type semiconductors are in direct contact with at least a part of the n-type semiconductor layer,
the two or more p-type semiconductors include a second oxide semiconductor and one or more elements selected from Ca, H, Li, Na, K, Rb, Cs, Fr, Be, Sr, Ba, Ra, Mn, Pd, Cu, Ag, Au, Cd, Hg, TI, Pb, and P,
a distance between adjacent p-type semiconductors in the two or more p-type semiconductors is in a range of from 0.125 μm to 4 μm, and
a depth of the two or more p-type semiconductor is in a range of from 0.125 μm to 4 μm.

15. The semiconductor device according to claim 14,
wherein the second oxide semiconductor is crystalline oxide semiconductor.

16. A semiconductor device, comprising:
an n-type semiconductor layer;
one or more p-type semiconductors; and
an electrode, wherein
the one or more p-type semiconductors are provided between the n-type semiconductor layer and the electrode,
at least a first part of the one or more p-type semiconductors is embedded in the n-type semiconductor layer,
the n-type semiconductor layer includes an oxide semiconductor as a major component,
at least a second part of the one or more p-type semiconductors is protruded in the electrode,
the one or more p-type semiconductors include a mixed crystal of $Ga_2O_3$ and one or more metal oxides, and
the one or more metal oxides include aluminum oxide, indium oxide, iridium oxide, rhodium oxide or iron oxide.

* * * * *